US008330745B2

United States Patent
Yokoyama et al.

(10) Patent No.: US 8,330,745 B2
(45) Date of Patent: Dec. 11, 2012

(54) PULSE OUTPUT CIRCUIT, AND DISPLAY DEVICE, DRIVE CIRCUIT, DISPLAY DEVICE, AND PULSE OUTPUT METHOD USING SAME CIRCUIT

(75) Inventors: Makoto Yokoyama, Matsusaka (JP); Yuhichiroh Murakami, Matsusaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 707 days.

(21) Appl. No.: 12/312,216

(22) PCT Filed: Nov. 19, 2007

(86) PCT No.: PCT/JP2007/072376
§ 371 (c)(1),
(2), (4) Date: Apr. 30, 2009

(87) PCT Pub. No.: WO2008/090670
PCT Pub. Date: Jul. 31, 2008

(65) Prior Publication Data
US 2009/0315868 A1 Dec. 24, 2009

(30) Foreign Application Priority Data
Jan. 25, 2007 (JP) .................. 2007-015508

(51) Int. Cl.
*G06F 3/038* (2006.01)
*G11C 7/00* (2006.01)
(52) U.S. Cl. .............. 345/204; 327/57; 345/98
(58) Field of Classification Search .......... 345/204
See application file for complete search history.

(56) References Cited

U.S. PATENT DOCUMENTS

| 5,233,638 | A | * | 8/1993 | Moriwaki et al. ........... 377/55 |
| 6,580,423 | B1 | * | 6/2003 | Murade ..................... 345/204 |
| 6,909,417 | B2 | * | 6/2005 | Washio et al. ............... 345/98 |
| 2001/0014040 | A1 | * | 8/2001 | Ooishi ....................... 365/200 |
| 2003/0174115 | A1 | * | 9/2003 | Washio et al. ............... 345/98 |
| 2005/0030276 | A1 | * | 2/2005 | Murakami et al. .......... 345/102 |
| 2005/0134352 | A1 | * | 6/2005 | Yokoyama et al. ......... 327/291 |

FOREIGN PATENT DOCUMENTS

| JP | 5-241536 | 9/1993 |
| JP | 9-212133 | 8/1997 |
| JP | 9-212199 | 8/1997 |
| JP | 2005-192201 | 7/2005 |

* cited by examiner

*Primary Examiner* — Amare Mengistu
*Assistant Examiner* — Mihir Rayan
(74) *Attorney, Agent, or Firm* — Harness, Dickey & Pierce

(57) ABSTRACT

In one embodiment of the present invention, a source driver includes a shift register including latch stages each including a level shifter that level-shifts clock signals so that the signals are fed into a set-reset flip-flop as inverted set input signals. Outputs from the set-reset flip-flop are delayed by a hazard preventing circuit and then fed into a level shifter in the next latch stage as enable signals. A delay trimming circuit causes a NAND circuit to perform a NAND operation with respect to outputs obtained by a delay of the outputs by a delay circuit and outputs from the level shifter in the next latch stage, so that a sampling pulse is derived. This allows for provision of a pulse output circuit capable of further trimming delay in output pulses and of securing a sufficient interval between the output pulses.

8 Claims, 13 Drawing Sheets

PULSE OUTPUT CIRCUIT, AND DISPLAY DEVICE, DRIVE CIRCUIT, DISPLAY DEVICE, AND PULSE OUTPUT METHOD USING SAME CIRCUIT

TECHNICAL FIELD

The present invention relates to a signal used to supply data to a display device such as a liquid crystal display device.

BACKGROUND ART

As high-resolution technology in liquid crystal display devices advances, the period for sampling data to be supplied to data signal lines by dot sequential driving is becoming increasingly short. Data is supplied to the data signal lines in accordance with switching on/off of analog switches, whose operation is controlled by sampling pulses that determine the period for sampling data. Thus, constantly carrying out normal display requires ending the sampling by sampling pulses within a data supply period for each data signal line. Specifically, continuing sampling beyond the data supply period into a period for supplying next data causes the potential of data signal lines to be disturbed due to different data. This indicates that preventing delay in such sampling pulses is important. In addition, even when a sampling pulse in a specific data signal line ends within its data supply period, rising of a sampling pulse in an adjacent data signal line before the above sampling pulse ends causes the potential charged in the specific data signal line by the time of the rising to be leaked into the adjacent data signal line, thereby disturbing the potential. This indicates that it is also important to secure an interval between adjacent sampling pulses so that they do not overlap each other.

Liquid crystal display devices with high resolution have extremely short data supply periods. This makes it highly difficult to keep the delay in sampling pulses within the data supply period and also to secure the interval between such sampling pulses.

Patent Literature 1 discloses an arrangement that simultaneously suppresses the delay and sufficiently secures the interval between sampling pulses.

FIG. 10 is a view illustrating an arrangement of a source driver 103 in a liquid crystal display device disclosed in Patent Literature 1.

The source driver 103 has latch stages, namely the i-th latch stage, the (i+1)th latch stage, the (i+2)th latch stage, . . . , which together constitute a shift register. Each of the latch stages includes a level shifter LS and an asynchronous set-reset flip-flop SR_FF. The level shifter LS level-shifts a clock signal SCK or SCKB so that internal circuits of the source driver 103 are driven. The level shifter LS supplies outputs OUTB to an inverted set input terminal SB of the set-reset flip-flop SR_FF. The clock signal SCK has a waveform illustrated in FIG. 11. The clock signal SCKB is an inverted signal of the clock signal SCK. When fed with active enable signals, level shifters LS in the odd latch stages level-shift one of the clock signals SCK and SCKB, while those in the even latch stages level-shift the other.

The set-reset flip-flop SR_FF supplies outputs Q to an enable terminal ENA of a level shifter LS in the next latch stage, as well as to a delay inverter circuit 103a as outputs to be fed into a sampling circuit block 101a. The set-reset flip-flop SR_FF has a reset terminal that is fed with outputs Q from a set-reset flip-flop SR_FF in the next latch stage. The delay inverter circuit 103a supplies outputs to a level shifter 103b. The level shifter 103b supplies sampling pulses from its output OUTB in response to enable signals, i.e., the outputs Q from the set-reset flip-flop SR_FF in the next latch stage. Sampling pulses outputted are supplied sequentially into analog switches ASW (Ri), ASW (Gi), ASW (Bi), ASW (Ri+1), . . . of the sampling circuit block 101a, where sampling is performed on data DATA(i), DATA(i+1), . . . (each including distinct portions for R, G, and B) that are supplied within their respective data supply periods.

FIG. 11 is a signal timing chart of the above operation. The output Q(i) represents an output Q from the i-th set-reset flip-flop SR_FF. The output Q(i) is generated after a clock signal SCK is level-shifted by a level shifter LS and is then fed into the set input terminal SB. The output Q(i) is a signal that starts when a delay time Ta, i.e., the sum of (i) an internal delay time of the level shifter LS and (ii) an internal delay time of the set-reset flip-flop SR_FF, has elapsed after the clock signal SCK rises. The output Q(i) is reset by an output Q(i+1) from a set-reset flip-flop SR_FF in the next latch stage. Thus, the output Q(i) ends when the internal delay time Tb of the set-reset flip-flop SR_FF has elapsed after the timing at which the output Q(i+1) starts. The output Q(i+1) is a signal that starts when the delay time Ta has elapsed after the clock signal SCKB rises. The output Q(i) is delayed by a delay inverter circuit 103a so as to change into an input signal to be fed into an input terminal IN of a level shifter 103b.

The level shifter 103b supplies an output OUTB that starts at the timing at which the input signal into the input terminal IN starts. In contrast, since the set-reset flip-flop SR_FF in the next latch stage supplies the output Q(i+1) to an enable terminal EN of the level shifter 103b, the output OUTB ends at timing earlier than the timing at which the input signal into the input terminal IN ends, i.e., at timing defined by the timing at which the input signal into the enable terminal EN ends. As illustrated in FIG. 11, this consequently allows for generation of a sampling pulse having a delay with a portion trimmed, the portion being represented by the area filled with diagonal lines and corresponding to the sum of (i) the delay time Tb and (ii) a delay time due to the delay inverter circuit 103a. Further, as illustrated in FIG. 11, this delay trimming allows for a sufficient interval between the sampling pulse and another sampling pulse generated in the next latch stage.

CITATION LIST

Patent Literature 1

Japanese Patent Application Publication, Tokukai, No. 2005-192201 A (Publication Date: Jul. 14, 2005)

SUMMARY OF INVENTION

The above conventional arrangement causes the output Q(i+1) from the set-reset flip-flop SR_FF in the next latch stage to be fed into the enable terminal ENA of the level shifter 103b for the purpose of trimming delay in the sampling pulse. However, the output Q(i+1) starts at timing at which the delay time Ta, i.e., the sum of (i) the internal delay time of the level shifter LS and (ii) the internal delay time of the set-reset flip-flop SR_FF, has elapsed after the clock signal SCKB (or SCK) level-shifted in the (i+1)th latch stage rises. This prevents trimming of a further portion of delay in the sampling pulse, the portion occurring before the above timing. While designing a panel having higher resolution requires higher-frequency operation, the above incapability to further trim delay in the sampling pulse means inability to trim delay in accordance with such higher-frequency operation.

As is clear from FIG. 11, according to Patent Literature 1, the clock signal SCK or SCKB is level-shifted by the level shifter LS, and subsequently outputted from the set-reset flip-flop SR_FF as an output Q, which is then delayed by the delay inverter circuit 103a so that its start timing is delayed, whereby a sampling pulse is generated. In view of this, Patent Literature 1 takes advantage of the use of the start timing of an output Q(i+1), which determines the end timing of the output Q(i), so that the sampling pulse, which would otherwise have end timing delayed as a result of the above delay, has end timing closer to the vicinity of the end timing of the output Q(i), i.e., a signal before the delay. This principle similarly applies to an arrangement disclosed in Patent Literature 1 that generates sampling pulses having a length obtained by multiplication, by an integer of two or more, of half the signal period of the clock signals SCK and SCKB, since the sampling pulses are generated using outputs Q from a set-reset flip-flop SR_FF in a subsequent latch stage.

The arrangement that determines the end timing of outputs Q in a specific latch stage with use of the start timing of outputs Q in a subsequent latch stage accords with a conventional art before the disclosure of Patent Literature 1. Unfortunately, the use of such a conventional art in delay trimming now impedes easy generation of sampling pulses for use in higher-resolution technology.

The present invention has been accomplished in view of the above problem. It is an object of the present invention to provide (i) a pulse output circuit capable of further trimming delay in output pulses and of securing a sufficient interval between the output pulses, (ii) a display device drive circuit including the pulse output circuit, (iii) a display device including the pulse output circuit, and (iv) a pulse output method using the pulse output circuit.

In order to attain the above object, a pulse output circuit of the present invention is a pulse output circuit for sequentially outputting pulses from different output terminals, the pulse output circuit including: first pulse generating means including a shift register having latch stages, connected in series, which have flip-flops for generating first pulses serving as source pulses of the pulses outputted from the output terminals, respectively; and second pulse generating means for (i) generating second pulses from the first pulses of the latch stages, respectively, each of the second pulses having end timing generated using timing of a pulse which has not passed through a flip-flop in a predetermined latch stage which is a target latch stage or a latch stage following the target latch stage and (ii) outputting the second pulses as the pulses outputted from the output terminals, respectively.

The above allows for provision of a pulse output circuit capable of further trimming delay in output pulses and of securing a sufficient interval between the output pulses.

In order to attain the above object, a pulse output circuit of the present invention is a pulse output circuit for sequentially outputting pulses from different output terminals, the pulse output circuit including: first pulse generating means including a shift register having latch stages, connected in series, which have flip-flops for generating first pulses serving as source pulses of the pulses outputted from the output terminals, respectively; and second pulse generating means for (i) generating second pulses from the first pulses, respectively, each of the second pulses having: start timing obtained by a delay of start timing of a first pulse; and end timing generated using start timing of an input pulse to a flip-flop in a following latch stage existing a predetermined number of latch stages after a latch stage in which the first pulse is generated the input pulse not having passed through the flip-flop of the following latch stage and (ii) outputting the second pulse as a pulse to be outputted from a corresponding one of the output terminals.

According to the above invention, the first pulse generating means generates first pulses with use of the flip-flops in the latch stages of the shift register. The second pulse generating means generates second pulses in response to the first pulses and sequentially outputs the second pulses from its output terminals. Each of the second pulses has start timing obtained by a delay of start timing of a first pulse; and end timing generated using start timing of an input pulse to the flip-flop in a following latch stage a predetermined number of latch stages after the latch stage in which the first pulse is generated, the input pulse not having passed through the flip-flop. The start timing of an input pulse to the flip-flop in the following latch stage occurs before the start timing of an output pulse from the flip-flop in the following latch stage. This allows for earlier end timing of the second pulse.

This allows for further trimming of delay in the second pulses and for a sufficient interval between the second pulse and another second pulse generated in an adjacent latch stage.

The above allows for provision of a pulse output circuit capable of further trimming delay in output pulses and of securing a sufficient interval between the output pulses.

In order to attain the above object, the pulse output circuit of the present invention may be arranged such that each of the flip-flops is a set-reset flip-flop; and each of the latch stages includes a level shifter for level-shifting an input clock signal so as to generate an input pulse to a flip-flop, in response to an enable signal generated in accordance with an output signal from a flip-flop of a latch stage which is followed by the latch stage in which the first pulse is generated.

According to the above invention, the level shifter level-shifts a clock signal in response to an enable signal so as to generate an input pulse to the flip-flop. Further, the enable signal is generated in accordance with an output signal from the flip-flop in the latch stage which is followed by the latch stage in which the first pulse is generated.

The above allows for further trimming of delay in output pulses and also for securement of a sufficient interval between the output pulses in a pulse output circuit including a shift register having latch stages each including: a level shifter that level-shifts clock signals; and a set-reset flip-flop that uses outputs from the shift register as input pulses.

In order to attain the above object, the pulse output circuit of the present invention may be arranged such that: each of the flip-flops is a set-reset flip-flop; the predetermined number of latch stages is one; and each of the latch stages includes a level shifter for level-shifting an input clock signal so as to generate an input pulse to a flip-flop, in response to an enable signal generated by a delay of an output signal from a flip-flop of a latch stage which is followed by the latch stage in which the first pulse is generated.

According to the above invention, the predetermined number of latch stages is one, and the pulse output circuit includes a shift register having latch stages each including: a level shifter that level-shifts clock signals; and a set-reset flip-flop that uses outputs from the shift register as input pulses. Thus, the pulse output circuit is capable of outputting second pulses corresponding to half the signal period of a clock signal. In addition to this arrangement, an output signal from the flip-flop in the latch stage which is followed by the latch stage in which the first pulse is generated is delayed so as to change into an enable signal. This prevents a problem of inability to normally generate second pulses due to an excessively short pulse period of outputs from the level shifter.

In order to attain the above object, the pulse output circuit of the present invention may be arranged such that: each of the flip-flops is a set-reset flip-flop; the predetermined number of latch stages is an integer of two or more; each of the latch stages includes a level shifter for level-shifting, in accordance with an enable signal inputted, an input clock signal so as to generate an input pulse to a flip-flop; and the enable signal is generated, by a logic operation carried out with respect to (i) an output signal from a flip-flop of a latch stage which is followed by the latch stage in which the first pulse is generated and (ii) a signal obtained by a delay of an output signal from a flip-flop of the latch stage in which the first pulse is generated, as a signal having a pulse having end timing delayed relative to start timing of a pulse of the output signal from the flip-flop in the latch stage in which the first pulse is generated.

According to the above invention, the predetermined number of latch stages is an integer of two or more, and the pulse output circuit includes a shift register having latch stages each including: a level shifter that level-shifts clock signals; and a set-reset flip-flop that uses outputs from the shift register as input pulses. Thus, the pulse output circuit is capable of outputting second pulses corresponding to a multiple of half the signal period of a clock signal by the above integer. In addition to this arrangement, the enable signal is generated by a logic operation with respect to (i) an output signal from the flip-flop in the latch stage which is followed by the latch stage in which the first pulse is generated and (ii) a signal obtained by a delay of an output signal from the flip-flop in the latch stage in which the first pulse is generated, as a signal having a pulse having end timing delayed relative to the start timing of the pulse of the output signal from the flip-flop in the latch stage in which the first pulse is generated. This prevents a problem of inability to normally generate second pulses due to an excessively short pulse period of outputs from the level shifter.

In order to attain the above object, the pulse output circuit of the present invention may be arranged such that: each of the flip-flops is a set-reset flip-flop; the predetermined number of latch stages is an integer of two or more; each of the latch stages includes a level shifter for level-shifting, in accordance with an enable signal inputted, an input clock signal so as to generate an input pulse to a flip-flop; and the enable signal is generated, by a delay of a signal obtained by a logic operation carried out with respect to (i) an output signal from a flip-flop in a latch stage which is followed by the latch stage in which the first pulse is generated and (ii) an output signal from a flip-flop in the latch stage in which the first pulse is generated, as a signal having a pulse having end timing delayed relative to start timing of a pulse of the output signal from the flip-flop in the latch stage in which the first pulse is generated.

According to the above invention, the predetermined number of latch stages is an integer of two or more, and the pulse output circuit includes a shift register having latch stages each including: a level shifter that level-shifts clock signals; and a set-reset flip-flop that uses outputs from the shift register as input pulses. Thus, the pulse output circuit is capable of outputting second pulses corresponding to a multiple of half the signal period of a clock signal by the above integer. In addition to this arrangement, the enable signal is generated by a delay of a signal obtained by a logic operation with respect to (i) an output signal from the flip-flop in the latch stage which is followed by the latch stage in which the first pulse is generated and (ii) an output signal from the flip-flop in the latch stage in which the first pulse is generated, as a signal having a pulse having end timing delayed relative to the start timing of the pulse of the output signal from the flip-flop in the latch stage in which the first pulse is generated. This prevents a problem of inability to normally generate second pulses due to an excessively short pulse period of outputs from the level shifter.

In order to attain the above object, the pulse output circuit of the present invention may be arranged such that: each of the flip-flops is a set-reset flip-flop; and each of the latch stages generates, as an input pulse to the flip-flop, a pulse having start timing generated, by a logic operation carried out with respect to (i) two kinds of clock signals and (ii) an output signal from a flip-flop in a latch stage which is followed by the latch stage in which the first pulse is generated, from timing of a predetermined one of the clock signals.

According to the above invention, the latch stages each generate a pulse having start timing generated, by a logic operation with respect to (i) two kinds of clock signals and (ii) an output signal from the flip-flop in the latch stage which is followed by the latch stage in which the first pulse is generated, from the timing of a predetermined one of the clock signals.

The above allows for further trimming of delay in output pulses and also for securement of a sufficient interval between the output pulses in a pulse output circuit that includes no level shifter in the latch stages of the shift register and that is capable of normally generating second pulses even when the two kinds of clock signals have level inversion timings different from each other.

In order to attain the above object, the pulse output circuit of the present invention may be arranged such that: the predetermined number of latch stages is one; and the logic operation includes an operation for first delaying the output signal from the flip-flop in the latch stage which is followed by the latch stage in which the first pulse is generated.

According to the above invention, the predetermined number of latch stages is one. Thus, the pulse output circuit is capable of outputting second pulses corresponding to half the signal period of a clock signal. In addition to this arrangement, the logic operation for generating input pulses to the flip-flop includes an operation for first delaying the output signals from the flip-flop in the latch stage which is followed by the latch stage in which the first pulse is generated. This prevents a problem of inability to normally generate second pulses due to an excessively short pulse period of outputs obtained by the logic operation.

In order to attain the above object, the pulse output circuit of the present invention may be arranged such that the input pulse to the flip-flop in the following latch stage is used as a reset signal for a flip-flop in the latch stage in which the first pulse is generated.

According to the above invention, the start timing of the input pulse to the flip-flop in the following latch stage is used to generate the end timing of the output pulse from the flip-flop in the latch stage in which the first pulse is generated. This allows a first pulse, which is an output pulse from the flip-flop, to be generated in accordance with the pulse period of a second pulse to be generated.

In order to attain the above object, the pulse output circuit of the present invention may be arranged such that: the predetermined number of latch stages is one; and a pulse obtained by a delay of an input pulse to a flip-flop of a latch stage which follows the latch stage in which the first pulse is generated is used as a reset signal for a flip-flop in the latch stage in which the first pulse is generated.

According to the above invention, the predetermined number of latch stages is one. Thus, the pulse output circuit is capable of outputting second pulses corresponding to half the signal period of a clock signal. In addition to this arrangement, a signal obtained by a delay of an input pulse to the flip-flop is used as a reset signal for the flip-flop in the latch stage in which the first pulse is generated. This prevents a problem of inability to normally generate second pulses due to an excessively short pulse period of outputs obtained by the logic operation for generating input pulses to the flip-flop.

Further, the timing obtained by a delay of the start timing of an input pulse to the flip-flop in the next latch stage is used to generate the end timing of an output pulse from the flip-flop in the latch stage in which the first pulse is generated. This allows a first pulse, which is an output pulse from the flip-flop, to be generated in accordance with the pulse period of a second pulse to be generated.

In order to attain the above object, a pulse output circuit of the present invention is a pulse output circuit for sequentially outputting pulses from different output terminals, the pulse output circuit including: first pulse generating means including a shift register having latch stages, connected in series, which have D flip-flops for generating first pulses as source pulses for the pulses outputted from the output terminals, respectively; and second pulse generating means for (i) generating second pulses from the first pulses, each of the second pulses having end timing generated using timing of an input clock signal to a clock input terminal of a D flip-flop in a predetermined latch stage which is a target latch stage or a latch stage following the target latch stage, the input clock signal not passing through the D flip-flop of the predetermined latch stage, and (ii) outputting the second pulse as a pulse to be outputted from a corresponding one of the output terminals.

The above allows for provision of a pulse output circuit capable of further trimming delay in output pulses and of securing a sufficient interval between the output pulses.

In order to attain the above object, a drive circuit for a display device of the present invention includes any one of the above pulse output circuits, wherein the second pulse is outputted as a sampling pulse for a video signal of the display device.

This allows for provision of a display device drive circuit capable of fast display, the display device drive circuit being compatible with a display device including a panel of higher resolution.

In order to attain the above object, a display device of the present invention includes the display device drive circuit.

This allows for provision of a display device including a panel of higher resolution.

In order to attain the above object, a pulse output method of the present invention is a pulse output method for sequentially outputting pulses from different output terminals, the pulse output circuit including the steps of: generating, with use of flip-flops in latch stages of a shift register, first pulses serving as source pulses for the pulses outputted from the output terminals, respectively; and generating second pulses from the first pulses of the latch stages, each of the second pulses having end timing generated using timing of a pulse which has not passed through a flip-flop in a predetermined latch stage which is a target latch stage or a latch stage following the target latch stage so that the second pulses are outputted as the pulses outputted from the output terminals, respectively.

The above allows for provision of a pulse output method allowing for further trimming of delay in output pulses and for securement of a sufficient interval between the output pulses.

In order to attain the above object, a pulse output method of the present invention is a pulse output method for sequentially outputting pulses from different output terminals, the pulse output circuit including the steps of: generating, with use of flip-flops in latch stages of a shift register, first pulses as source pulses for the pulses outputted from the output terminals, respectively; and generating second pulses from the first pulses, each of the second pulses having: start timing obtained by a delay of start timing of a first pulse; and end timing generated using start timing of an input pulse to a flip-flop in a following latch stage existing a predetermined number of latch stages after a latch stage in which the first pulse is generated, the input pulse not having passed through the flip-flop of the following latch stage so that the second pulses are outputted as the pulses outputted from the output terminals, respectively.

According to the above invention, a first pulse is generated with use of the flip-flops in the latch stages of the shift register. In response to the first pulses, second pulses are generated, whereby the second pulses are sequentially outputted from its output terminals. Each of the second pulses has start timing obtained by a delay of start timing of a first pulse; and end timing generated using start timing of an input pulse to the flip-flop in a following latch stage a predetermined number of latch stages after the latch stage in which the first pulse is generated, the input pulse not having passed through the flip-flop. The start timing of an input pulse to the flip-flop in the following latch stage occurs before the start timing of an output pulse from the flip-flop in the following latch stage. This allows for earlier end timing of the second pulse.

This allows for further trimming of delay in the second pulse and for a sufficient interval between the second pulse and another second pulse generated in an adjacent latch stage.

The above allows for provision of a pulse output method allowing for further trimming of delay in output pulses and for securement of a sufficient interval between the output pulses.

In order to attain the above object, the pulse output method of the present invention may be arranged such that: each of the flip-flops is a set-reset flip-flop; and each of the latch stages includes a level shifter for level-shifting an input clock signal so as to generate an input pulse to a flip-flop, in response to an enable signal generated in accordance with an output signal from a flip-flop of a latch stage which is followed by the latch stage in which the first pulse is generated.

According to the above invention, the level shifter level-shifts a clock signal in response to an enable signal so as to generate an input pulse to the flip-flop. Further, the enable signal is generated in accordance with an output signal from the flip-flop in the latch stage which is followed by the latch stage in which the first pulse is generated.

The above allows for further trimming of delay in output pulses and also for securement of a sufficient interval between the output pulses in a pulse output method applicable to an arrangement including a shift register having latch stages each including: a level shifter that level-shifts clock signals; and a set-reset flip-flop that uses outputs from the shift register as input pulses.

In order to attain the above object, the pulse output method of the present invention may be arranged such that: each of the flip-flops is a set-reset flip-flop; the predetermined number of latch stages is one; and each of the latch stages includes a level shifter for level-shifting an input clock signal so as to generate an input pulse to a flip-flop, in response to an enable signal generated by a delay of an output signal from a flip-flop of a latch stage which is followed by the latch stage in which the first pulse is generated.

According to the above invention, the predetermined number of latch stages is one, and the pulse output circuit includes a shift register having latch stages each including: a level shifter that level-shifts clock signals; and a set-reset flip-flop that uses outputs from the shift register as input pulses. Thus, the pulse output method allows for output of second pulses corresponding to half the signal period of a clock signal. In addition to this arrangement, an output signal from the flip-flop in the latch stage which is followed by the latch stage in which the first pulse is generated is delayed so as to change into an enable signal. This prevents a problem of inability to normally generate second pulses due to an excessively short pulse period of outputs from the level shifter.

In order to attain the above object, the pulse output method of the present invention may be arranged such that: each of the flip-flops is a set-reset flip-flop; the predetermined number of latch stages is an integer of two or more; each of the latch stages includes a level shifter for level-shifting, in accordance with an enable signal inputted, an input clock signal so as to generate an input pulse to a flip-flop; and the enable signal is generated, by a logic operation carried out with respect to (i) an output signal from a flip-flop of a latch stage which is followed by the latch stage in which the first pulse is generated and (ii) a signal obtained by a delay of an output signal from a flip-flop of the latch stage in which the first pulse is generated, as a signal having a pulse having end timing delayed relative to start timing of a pulse of the output signal from the flip-flop in the latch stage in which the first pulse is generated.

According to the above invention, the predetermined number of latch stages is an integer of two or more, and the pulse output circuit includes a shift register having latch stages each including: a level shifter that level-shifts clock signals; and a set-reset flip-flop that uses outputs from the shift register as input pulses. Thus, the pulse output method allows for output of second pulses corresponding to a multiple of half the signal period of a clock signal by the above integer. In addition to this arrangement, the enable signal is generated by a logic operation with respect to (i) an output signal from the flip-flop in the latch stage which is followed by the latch stage in which the first pulse is generated and (ii) a signal obtained by a delay of an output signal from the flip-flop in the latch stage in which the first pulse is generated, as a signal having a pulse having end timing delayed relative to the start timing of the pulse of the output signal from the flip-flop in the latch stage in which the first pulse is generated. This prevents a problem of inability to normally generate second pulses due to an excessively short pulse period of outputs from the level shifter.

In order to attain the above object, the pulse output method of the present invention may be arranged such that: each of the flip-flops is a set-reset flip-flop; the predetermined number of latch stages is an integer of two or more; each of the latch stages includes a level shifter for level-shifting, in accordance with an enable signal inputted, an input clock signal so as to generate an input pulse to a flip-flop; and the enable signal is generated, by a delay of a signal obtained by a logic operation carried out with respect to (i) an output signal from a flip-flop in a latch stage which is followed by the latch stage in which the first pulse is generated and (ii) an output signal from a flip-flop in the latch stage in which the first pulse is generated, as a signal having a pulse having end timing delayed relative to start timing of a pulse of the output signal from the flip-flop in the latch stage in which the first pulse is generated.

According to the above invention, the predetermined number of latch stages is an integer of two or more, and the pulse output circuit includes a shift register having latch stages each including: a level shifter that level-shifts clock signals; and a set-reset flip-flop that uses outputs from the shift register as input pulses. Thus, the pulse output method allows for output of second pulses corresponding to a multiple of half the signal period of a clock signal by the above integer. In addition to this arrangement, the enable signal is generated by a delay of a signal obtained by a logic operation with respect to (i) an output signal from the flip-flop in the latch stage which is followed by the latch stage in which the first pulse is generated and (ii) an output signal from the flip-flop in the latch stage in which the first pulse is generated, as a signal having a pulse having end timing delayed relative to the start timing of the pulse of the output signal from the flip-flop in the latch stage in which the first pulse is generated. This prevents a problem of inability to normally generate second pulses due to an excessively short pulse period of outputs from the level shifter.

In order to attain the above object, the pulse output method of the present invention may be arranged such that: each of the flip-flops is a set-reset flip-flop; and each of the latch stages generates, as an input pulse to the flip-flop, a pulse having start timing generated, by a logic operation carried out with respect to (i) two kinds of clock signals and (ii) an output signal from a flip-flop in a latch stage which is followed by the latch stage in which the first pulse is generated, from timing of a predetermined one of the clock signals.

According to the above invention, the latch stages each generate a pulse having start timing generated, by a logic operation with respect to (i) two kinds of clock signals and (ii) an output signal from the flip-flop in the latch stage which is followed by the latch stage in which the first pulse is generated, from the timing of a predetermined one of the clock signals.

The above allows for further trimming of delay in output pulses and also for securement of a sufficient interval between the output pulses in a pulse output method that uses no level shifter in the latch stages of the shift register and that allows for normal generation of second pulses even when the two kinds of clock signals have level inversion timing different from the other.

In order to attain the above object, the pulse output method of the present invention may be arranged such that: the predetermined number of latch stages is one; and the logic operation includes an operation for first delaying the output signal from the flip-flop in the latch stage which is followed by the latch stage in which the first pulse is generated.

According to the above invention, the predetermined number of latch stages is one. Thus, the pulse output method allows for output of a second pulse corresponding to half the signal period of a clock signal. In addition to this arrangement, the logic operation for generating an input pulse to be fed into the flip-flop includes an operation for first delaying the output signal fed from the flip-flop in the latch stage which is followed by the latch stage in which the first pulse is generated. This prevents a problem of inability to normally generate second pulses due to an excessively short pulse period of outputs obtained by the logic operation.

In order to attain the above object, the pulse output method of the present invention may be arranged such that the input pulse to the flip-flop in the following latch stage is used as a reset signal for a flip-flop in the latch stage in which the first pulse is generated.

According to the above invention, the start timing of the input pulse to the flip-flop in the following latch stage is used to generate the end timing of the output pulse from the flip-flop in the latch stage in which the first pulse is generated. This allows a first pulse, which is an output pulse from the flip-flop, to be generated in accordance with the pulse period of a second pulse to be generated.

In order to attain the above object, the pulse output method of the present invention may be arranged such that: the predetermined number of latch stages is one; and a pulse obtained by a delay of an input pulse to a flip-flop of a latch stage which follows the latch stage in which the first pulse is generated is used as a reset signal for a flip-flop in the latch stage in which the first pulse is generated.

According to the above invention, the predetermined number of latch stages is one. Thus, the pulse output method allows for output of second pulses corresponding to half the signal period of a clock signal. In addition to this arrangement, a signal obtained by a delay of an input pulse into the flip-flop is used as a reset signal for the flip-flop in the latch stage in which the first pulse is generated. This prevents a problem of inability to normally generate second pulses due to an excessively short pulse period of outputs obtained by the logic operation for generating an input pulse to the flip-flop.

Further, the timing obtained by a delay of the start timing of an input pulse to the flip-flop in the next latch stage is used to generate the end timing of an output pulse from the flip-flop in the latch stage in which the first pulse is generated. This allows a first pulse, which is an output pulse from the flip-flop, to be generated in accordance with the pulse period of a second pulse to be generated.

In order to attain the above object, a pulse output method of the present invention is a pulse output method for sequentially outputting pulses from different output terminals, the pulse output circuit including the steps of: generating, with use of D flip-flops in latch stages of a shift register, first pulses as source pulses for the pulses outputted from the output terminals, respectively; and generating second pulses from the first pulses, each of the second pulses having end timing generated using timing of an input clock signal to a clock input terminal of a D flip-flop in a predetermined latch stage which is a target latch stage or a latch stage following the target latch stage, the input clock signal not having passed through the D flip-flop in the predetermined latch stage, so that the second pulses are outputted as the pulses outputted from the output terminals, respectively.

The above allows for provision of a pulse output method allowing for further trimming of delay in output pulses and for securement of a sufficient interval between the output pulses.

Additional objects, features, and strengths of the present invention will be made clear by the description below. Further, the advantages of the present invention will be evident from the following explanation in reference to the drawings.

DESCRIPTION OF EMBODIMENTS

Each embodiment of the present invention is described below, with reference to FIGS. 1 through 9, 12, and 13.

Figure 9:
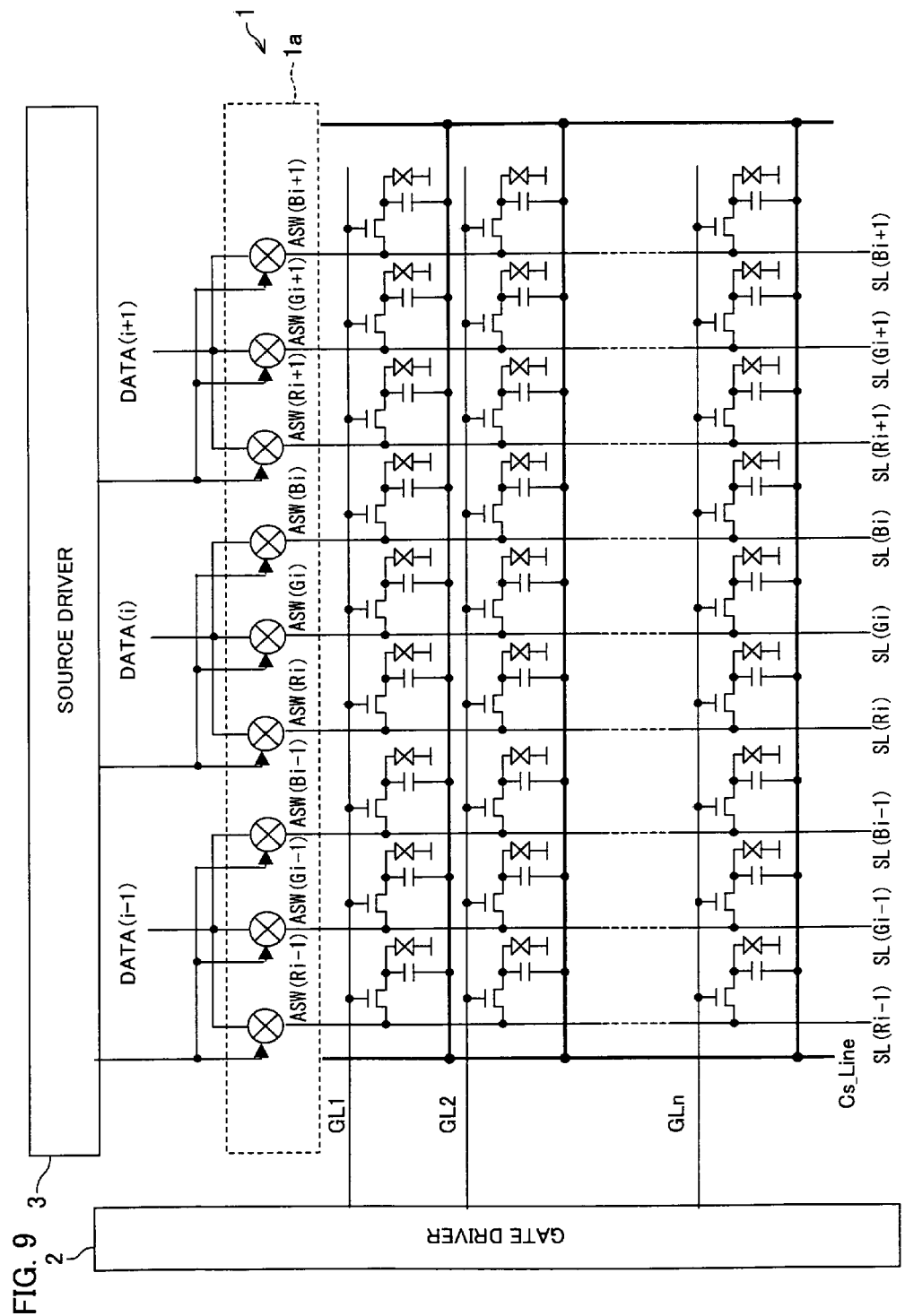
FIG. 9 is a circuit block diagram illustrating a main arrangement of a display panel included in a display device in accordance with an embodiment of the present invention.

FIG. 9 illustrates an arrangement of a display panel 1 of a liquid crystal display device according to the present embodiment. The display panel 1 includes: gate bus lines GL . . . ; source bus lines SL . . . corresponding to RGB; and pixels at the intersections of the gate bus lines GL and the source bus lines SL. The display panel 1 causes a source driver 3 to write video signals via the source bus lines SL to pixels in each gate bus line GL selected by a gate driver 2, so that display is carried out. Each of the pixels in the display panel 1 includes: a storage capacitor; a liquid crystal capacitor; and a TFT for receiving video signals from its corresponding source bus line SL. The storage capacitor has an end connected to an end of the storage capacitor of every other pixel via a storage capacitor line Cs-Line.

The display panel 1 further includes a sampling circuit block 1a. The sampling circuit block 1a includes: analog switches ASW provided for their respective source bus lines SL to sample video signals; and circuits for processing control signals for the analog switches (e.g., sampling buffers). The source driver 3 supplies signals (sampling pulses) for turning ON/OFF sampling switches ASW, for each set of source bus lines SL . . . corresponding to successive R, G, and B. The display panel 1 also includes video signal transmission lines provided so as to correspond to R, G, and B. This allows each set of sampling switches ASW for R, G, and B to individually and simultaneously sample video signals. For convenience of explanation, however, FIG. 9 illustrates a configuration in which such sampling switches ASW for R, G, and B sample video signals via a single common video signal transmission line. The sampling switches ASW for R, G, and B of each set may, as illustrated in FIG. 9, share a sampling pulse, i.e., a control signal for the sampling switches ASW, or may each receive a sampling pulse individually.

With respect to source bus lines SL for R, for example, the respective analog switches ASW connected to such source bus lines SL for R are turned ON by sampling pulses in the order of ASW (R1), . . . , ASW (Ri−1), ASW (Ri), ASW (Ri+1), . . . , during one horizontal period so that video signals are successively written to the pixels. The video signals DATA that are externally fed are thereby received by the source bus lines SL in the order as shown above.

The following description deals with an embodiment of the source driver 3.

Note that the present specification states "defining second timing by first timing" to refer to an instance of using the first timing to generate the second timing, which has been delayed due to an internal delay parasitically occurring in the circuit, whereas the present specification states "generating second timing by a delay of first timing" to refer to an instance of using the first timing to generate the second timing, which has intentionally been delayed by the circuit. The present specification describes a case of using a circuit including multiple inverters connected in series as a circuit that intentionally causes delay, and also clearly indicates that the above circuit has the function of causing delay, thereby making a distinction between such intentional delay and parasitic internal delay.

Embodiment 1

Figure 1:
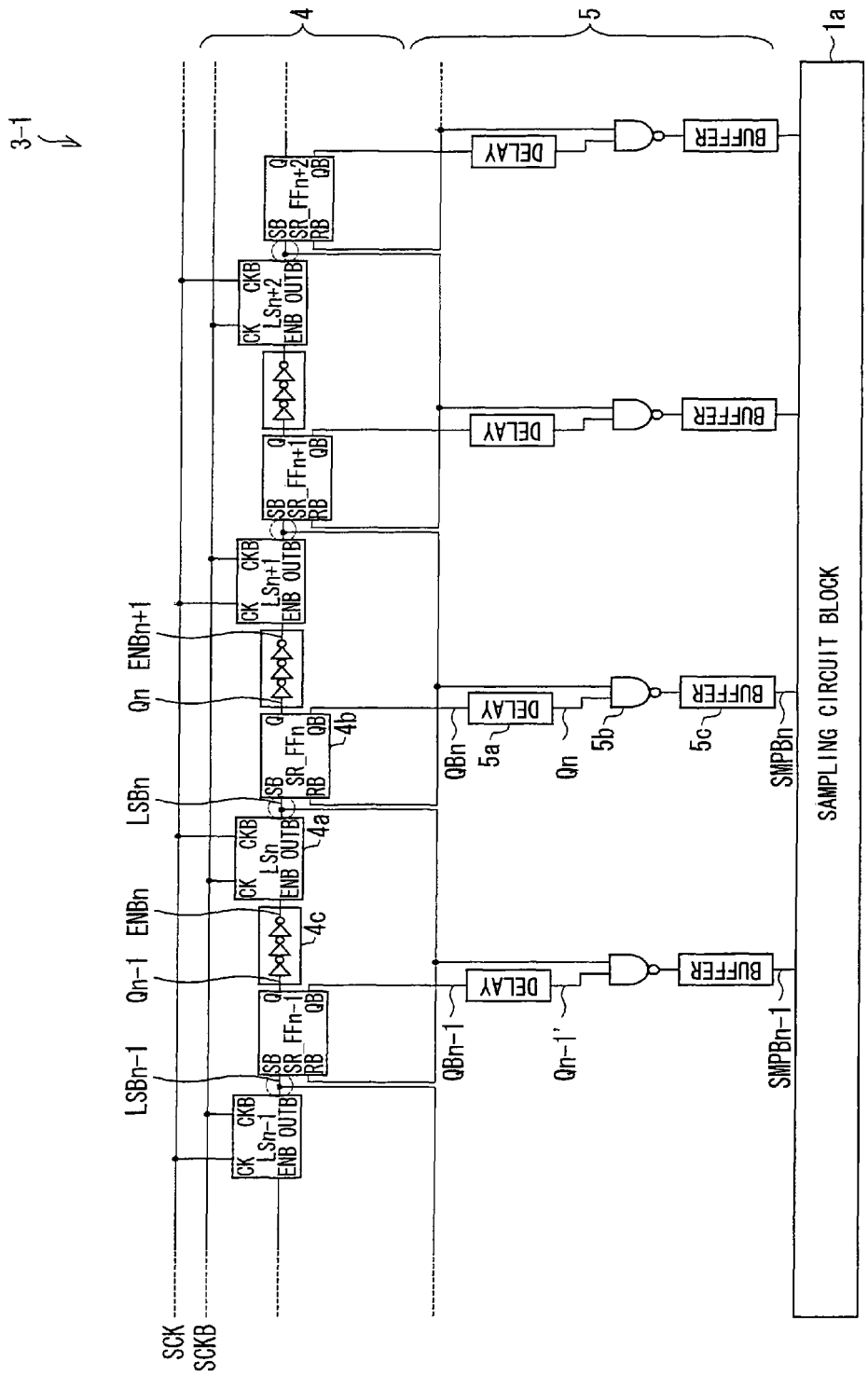
FIG. 1 is a circuit block diagram illustrating a main arrangement of a source driver in accordance with a first embodiment of the present invention.

FIG. 1 illustrates an arrangement of a source driver 3-1 of the present embodiment. The source driver 3-1 includes: a shift register (first pulse generating means) 4; and a delay trimming circuit (second pulse generating means) 5.

The shift register 4 has latch stages, each of which includes: a level shifter 4a; a set-reset flip-flop 4b; and a hazard preventing circuit 4c. FIG. 1 illustrates the (n−1)th latch stage through the (n+2)th latch stage.

Figure 2:
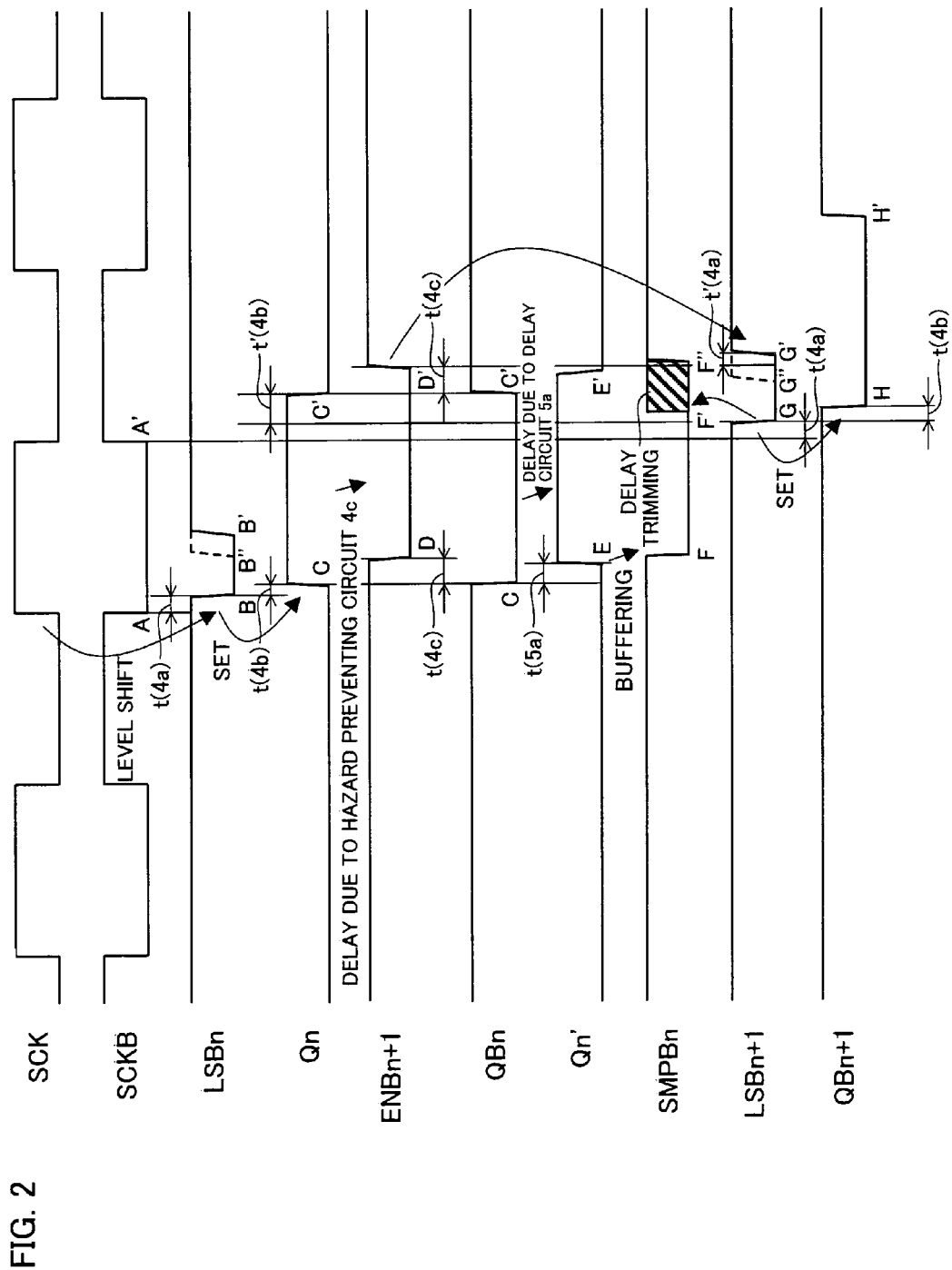
FIG. 2 is a timing chart explaining an operation of the source driver in FIG. 1.

The level shifter 4a has clock input terminals CK and CKB into which clock signals SCK and SCKB to be level-shifted are fed. As illustrated in FIG. 2, the clock signals SCK and SCKB are periodic signals, each of which has its High period and Low period equal to each other. The clock signals SCK and SCKB have their respective phases opposite to each other. One of the clock signals SCK and SCKB is fed into the clock input terminal CK, while the other is fed into the clock input terminal CKB. Such combination is set so as to be opposite between any adjacent latch stages. FIG. 1 illustrates an example arrangement in which: in the (n−1)th latch stage, the clock signal SCK is fed into the clock input terminal CK, while the clock signal SCKB is fed into the clock input terminal CKB; and, in the n-th latch stage, the clock signal SCKB is fed into the clock input terminal CK, while the clock signal SCK is fed into the clock input terminal CKB.

The level shifter 4a level-shifts the clock signal SCK or SCKB that has been fed into the clock input terminal CK and outputs the signal thus level-shifted through its output terminal OUTB. The level shifter 4a is of a current-driven type or of a voltage-driven type. The level shifter 4a has a low-active enable terminal ENB into which enable signals are fed, and carries out a level shift operation while the enable terminal ENB is fed with a Low signal, whereas it does not carry out a level shift operation while the enable terminal ENB is fed with a How signal. The level shifter 4a may be a conventional current-driven or voltage-driven level shifter, an example of which is disclosed in Patent Literature 1.

The level shifter 4a supplies outputs LSB (output signals from the output terminal OUTB are referred to as such for convenience) to an inverted set input terminal SB of the corresponding set-reset flip-flop 4b. The set-reset flip-flop 4b is an asynchronous set-reset flip-flop. When the level shifter 4a supplies a Low pulse as an input pulse from the output terminal OUTB to the inverted set input terminal SB, the set-reset flip-flop 4b outputs a High pulse from its output terminal Q and also outputs a Low pulse from its output terminal QB. The set-reset flip-flop 4b has a low-active reset terminal RB, which is fed with output signals from the output terminal OUTB of another level shifter 4a in the next latch stage.

The hazard preventing circuit 4c includes an odd number of inverters connected in series. The hazard preventing circuit 4c delays input signals and inverts the phase of such input signals. The hazard preventing circuit 4c is fed with outputs Q (output signals from an output terminal Q are referred to as such for convenience) from a set-reset flip-flop 4b in the latch stage which is followed by the latch stage which includes the above hazard preventing circuit 4c. The hazard preventing circuit 4c supplies outputs to the enable terminal ENB of the level shifter 4a. In other words, the hazard preventing circuit 4c generates, from the outputs Q from the set-reset flip-flop 4b in the latch stage which is followed by the latch stage which includes the above hazard preventing circuit 4c, enable signals ENB (signals fed into the enable terminal ENB are referred to as such for convenience) to be supplied to the level shifter 4a in the latch stage in which the above hazard preventing circuit 4c is provided. The hazard preventing circuit 4c carries out its phase inversion operation merely in conformity with the active polarity of an enable signal ENB, and therefore such a phase inversion operation is generally not required. A level shifter 4a in the first latch stage may be fed with enable signals that are not generated by a hazard preventing circuit 4c, but generated as appropriate.

The delay trimming circuit 5 includes, in correspondence with each latch stage of the shift register 4: a delay circuit 5a; a two-input NAND circuit 5b; and a buffer 5c. The delay circuit 5a includes an odd number of inverters connected in series. The delay circuit 5a delays input signals and inverts the phase of such input signals. The delay circuit 5a is fed with outputs QB (output signals from an output terminal QB are referred to as such for convenience) from the corresponding set-reset flip-flop 4b. The delay circuit 5a supplies outputs Q' to one of the inputs of the NAND circuit 5b. The other input of the NAND circuit 5b is fed with outputs OUTB from a level shifter 4a in the latch stage next to the latch stage which includes the above set-reset flip-flop 4b that generates the outputs QB fed into the delay circuit 5a.

The NAND circuit 5b supplies outputs as sampling pulses SMPB via the buffer 5c to the sampling circuit block 1a, where the outputs are fed into an analog switch ASW.

With reference to FIG. 2, the following description deals with how the source driver 3-1 having the above arrangement is operated. In the description, the above referential codes representing the signals are followed by their respective corresponding latch stage numbers.

With reference to FIG. 2, when the level shifter 4a in the n-th latch stage is fed with an active enable signal ENB, the level shifter 4a level-shifts a clock signal SCKB and starts to output an output LSB of a Low pulse at timing B. The timing B occurs when an internal delay time t (4a) due to the level shift operation by the level shifter 4a has elapsed after timing A at which the clock signal SCK rises and at which the clock signal SCKB falls. In accordance with this delay, the set-reset flip-flop 4b in the n-th latch stage starts to output, at timing C, an output Qn of a High pulse and an output QBn of a Low pulse. The timing C occurs when an internal delay time t (4b) due to the set operation by the set-reset flip-flop 4b has elapsed after the timing B.

The output Qn is delayed for a delay time t (4c) due to a hazard preventing circuit 4c in the (n+1)th latch stage so as to change into an enable signal ENBn+1, which turns active at timing D. A level shifter 4a in the (n+1)th latch stage level-shifts a clock signal SCK during the active period of the enable signal ENBn+1, and starts to output an output LSBn+1 of a Low pulse at timing G. The timing G occurs when the internal delay time t (4a) of the level shifter 4a has elapsed after timing A', which occurs half the signal period after the timing A.

The output LSBn+1 causes the set-reset flip-flop 4b in the n-th latch stage to be reset. This causes the outputs Qn and QBn to end at timing C', and also causes the pulse of the enable signal ENBn+1 to end at timing D'. The timing C' occurs when an internal delay time t' (4b) due to the reset operation by the set-reset flip-flop 4b has elapsed after the timing G. The timing D' occurs when the delay time t (4c) due to the hazard preventing circuit 4c has elapsed after the timing C'. The ending of the pulse of the enable signal ENBn+1 causes the pulse of the output LSBn+1 to end at timing G'. The timing G' occurs when an internal delay time t' (4a) due to deactivation of the level shifter 4a has elapsed after the timing D'.

Similarly, ending of the pulse of an enable signal ENBn causes the pulse of the output LSBn to end at timing B' although FIG. 2 omits its causal connection.

The output QBn is delayed for a delay time t (5a) and caused to have a phase inverted due to the delay circuit 5a so as to change into an output Qn'. The NAND circuit 5b performs a NAND operation with respect to the output Qn' and the output LSBn+1, and subsequently the buffer 5c performs buffering, so that a Low sampling pulse SMPBn is generated. The sampling pulse SMPBn has start timing F that is defined by start timing E of the pulse of the output Qn', i.e., by the start timing C of the pulse of the output QBn. Further, the sampling pulse SMPBn has end timing F' that is defined by the start timing G of the pulse of the output LSBn+1. Assuming that simply buffering the pulse of the output Qn' having the start timing E and the end timing E' causes the sampling pulse SMPBn to end at end timing F'', the pulse is so changed as to have a Low portion trimmed, the portion corresponding to the period from the timing F''' to the timing F' and being indicated by the area filled with the diagonal lines. The timing F' occurs when the start timing G of the pulse of the output LSBn+1 is delayed due to the buffering by the buffer 5c. This consequently generates as the sampling pulse SMPBn a pulse having its delay partly trimmed as above.

Since the output QBn+1 from the set-reset flip-flop 4b in the (n+1)th latch stage has a pulse that starts at timing H, which occurs when the internal delay time t (4b) of the set-reset flip-flop has elapsed after the start timing G of the pulse of the output LSBn+1, generating the sampling pulse SMPB as above allows the delay in the end timing of the sampling pulse SMPBn to be largely trimmed as compared to the case of defining the end timing by the start timing H of the pulse of the output QBn+1.

The following description deals with a hazard preventive function of the hazard preventing circuit 4c.

The hazard preventing circuit 4c delays outputs Q from its corresponding set-reset flip-flop 4b for the delay time t (4c) so as to generate enable signals ENBn. As illustrated in FIG. 2, the pulse of the enable signal ENBn+1 ends at the delayed timing D', which in turn causes the pulse of the output LSBn+1 from the level shifter 4a to end at the timing G'. The delay time t (4c) of the hazard preventing circuit 4c is set so that the timing G' is later than the end timing E' of the pulse of the output Qn'. This allows the result of the NAND operation by the NAND circuit 5b with respect to the output Qn' and the output LSBn+1 to remain High after the result is set to High at the start timing G of the output LSBn+1. This ensures that the delay in the sampling pulse SMPBn corresponding to the period F''' through F' is trimmed.

Figure 3:
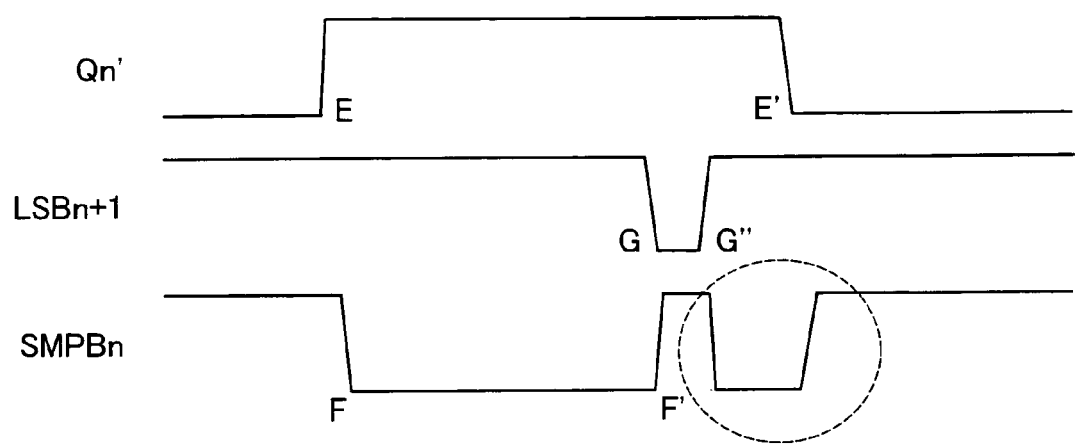
FIG. 3 is a timing chart explaining a hazard caused in the source driver in FIG. 1.

If the hazard preventing circuit 4c were not provided, the pulse of the enable signal ENBn+1 would end at the timing C', at which the output Qn ends. As illustrated in FIG. 2, this would cause the pulse of the output LSBn+1 to end at timing G'', which occurs before the timing G'. The timing G'' would occur when the internal delay time t' (4a) due to the level shifter 4a has elapsed after the timing C'. As illustrated in FIG. 3, if the timing G'' occurred before the end timing E' of the pulse of the output Qn', the result of the NAND operation by the NAND circuit 5b with respect to the output Qn' and the output LSBn+1 would be set to High at the start timing G of the output LSBn+1 and would thereafter be set to Low again for a certain period (circled by a dashed line). This latter Low pulse would cause a hazard in the sampling. The hazard preventing circuit 4c has the above function of preventing such a hazard in the sampling. However, no hazard occurs unless the timing G'' occurs before the timing E', even without the hazard preventing circuit 4c.

The purpose of providing the hazard preventing circuit 4c described above in the present embodiment is associated with the following: the level shifter 4a is so arranged as to have an enable terminal ENB and thereby has a period during which its level shift operation is suspended. As is clear from FIG. 2, the pulse period of the sampling pulse SMPB in the present embodiment has a delay trimmed on the basis of a period corresponding to half the signal period of the clock signals SCK and SCKB so as to be shorter than half the signal period. The set-reset flip-flop 4b has a pulse period corresponding to half the signal period of the clock signals SCK and SCKB. Thus, generating an enable signal ENB from the output Q as a shift signal for the next latch stage allows a level shifter 4a in the next latch stage to carry out a level shift operation on the clock signal SCK or SCKB so that an output LSB is derived which is necessary for an output Q of a set-reset flip-flop 4b in the next latch stage. Once the output LSB has been derived, earlier deactivation of the output LSB eliminates more of the need to generate set input signals that would otherwise be redundant, and consequently allows for reduction in the power consumption by the level shifter 4a.

In a level shifter without an enable terminal ENB, each level inversion of the clock signals SCK and SCKB would cause switching of internal transistors. This would result in power consumption due to switching loss as well as power loss caused by charging and discharging of the gate capacitance, the power consumption occurring in proportion to the clock frequency. This indicates that preventing the switching in a level shifter having an enable terminal ENB while the enable terminal ENB is fed with an inactive enable signal ENB allows the power consumption to be reduced accordingly. A current-driven level shifter has a steady current flowing inside even while the enable terminal ENB is fed with an inactive enable signal ENB, which results in power consumption. Thus, the above prevention of power consumption caused by the switching is especially important.

In view of the above, the enable signal ENB is set to have a pulse period corresponding to half the signal period of the clock signals SCK and SCKB so that the power consumption due to the switching is reduced to the minimum. This causes the pulse of the output LSB to end an extremely short period after its start. In other words, the designing of the level shifter 4a having reduced power consumption results in a short pulse period of the output LSB correspondingly. This might possibly cause a hazard in the sampling as described above. This is the reason why the hazard preventing circuit 4c is provided.

Figure 10:
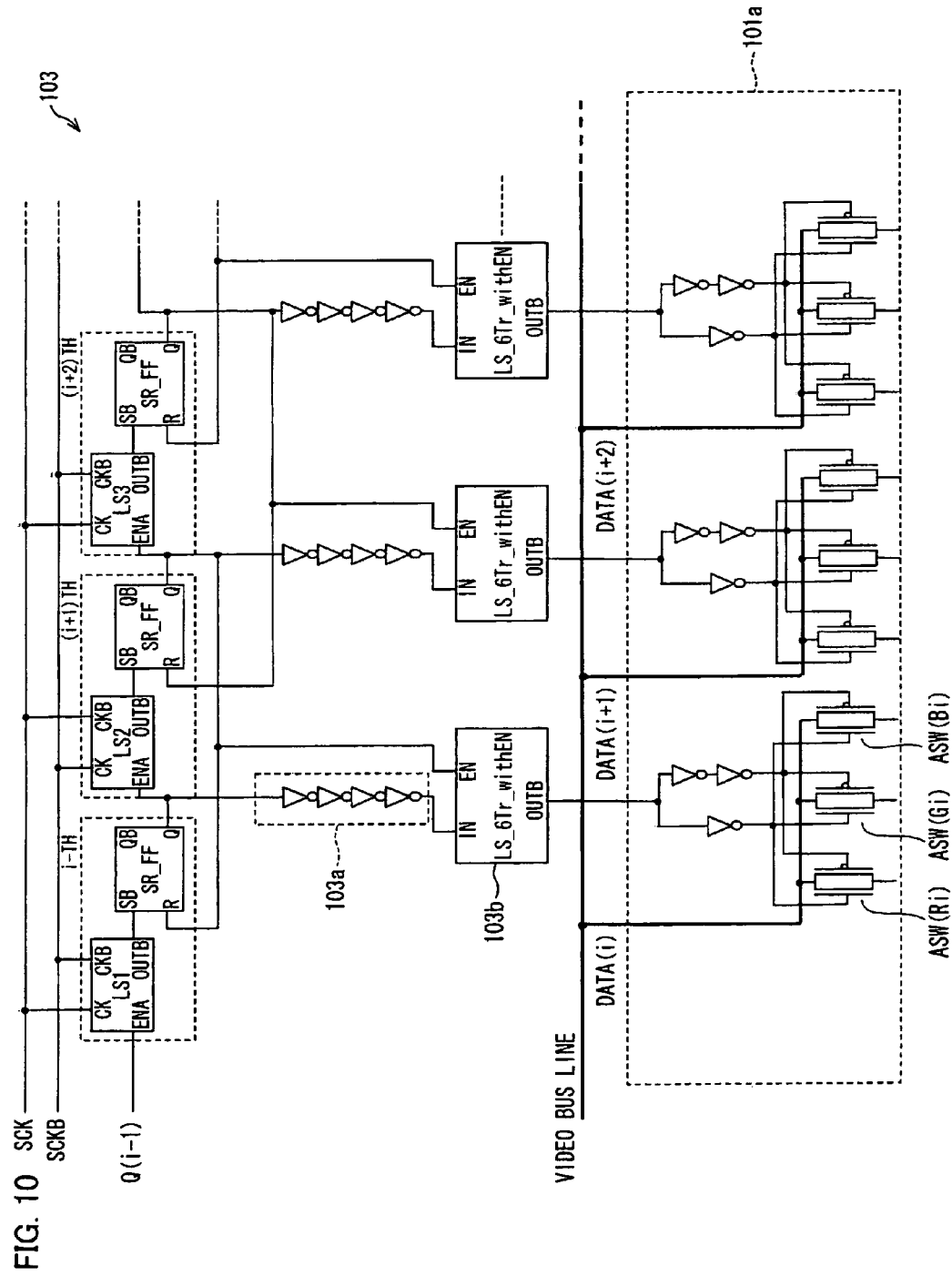
FIG. 10 is a circuit block diagram illustrating a main arrangement of a source driver of a conventional art.
Figure 11:
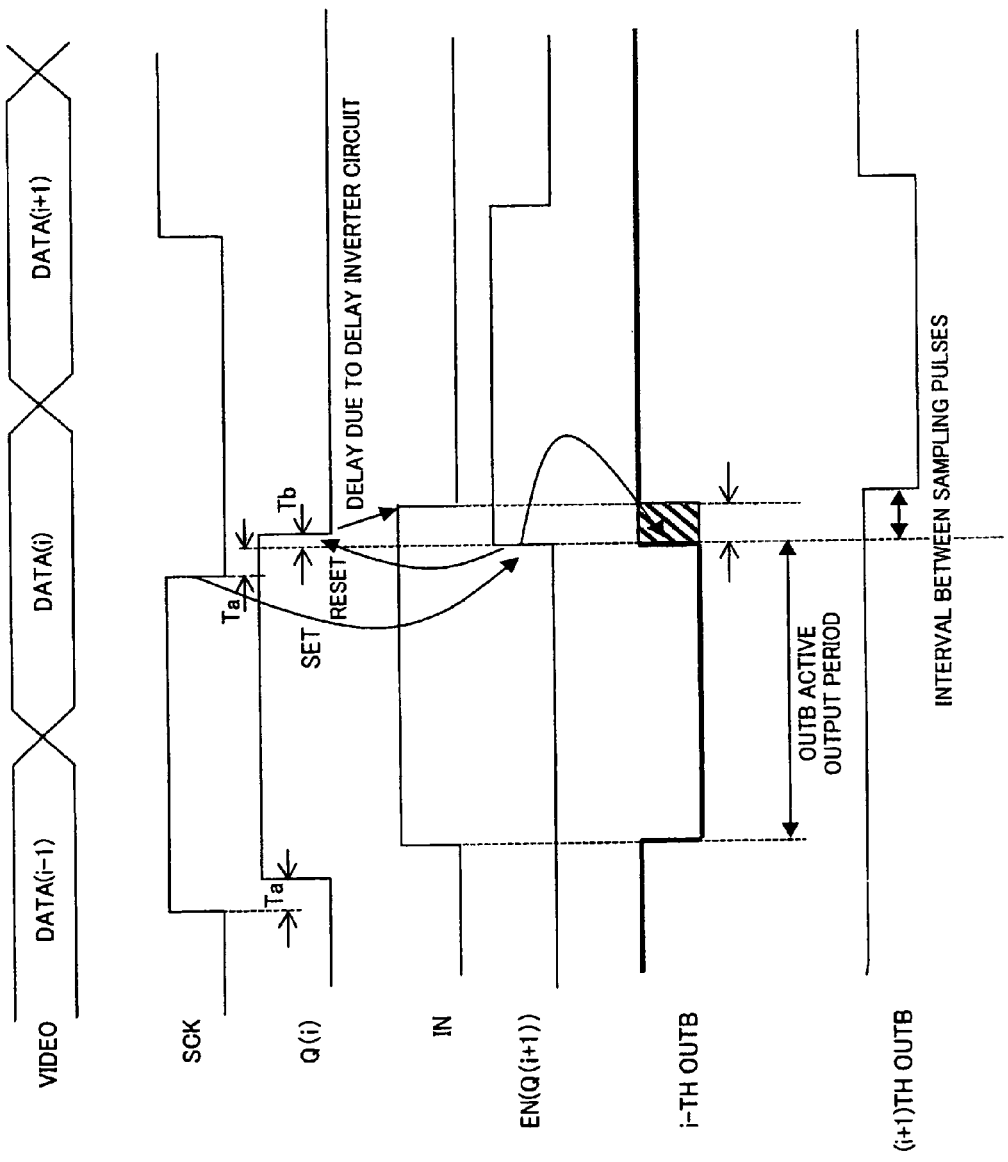
FIG. 11 is a timing chart explaining an operation of the source driver in FIG. 10.

The present embodiment is described as above. The embodiment includes NAND circuits 5b in the delay trimming circuit 5. However, in the case where it is necessary to level-shift sampling pulses for the purpose of driving the analog switches ASW in the sampling circuit block 1a, the NAND circuits 5b may be substituted by level shifters each of which has an enable terminal and uses an output Qn' as an input signal and an output LSBn+1 as an enable signal. In this case, conventional level shifters each having an enable terminal may be used. An example of such level shifters is the level shifter 103b in FIG. 10, disclosed in Patent Literature 1.

Embodiment 2

Figure 4:
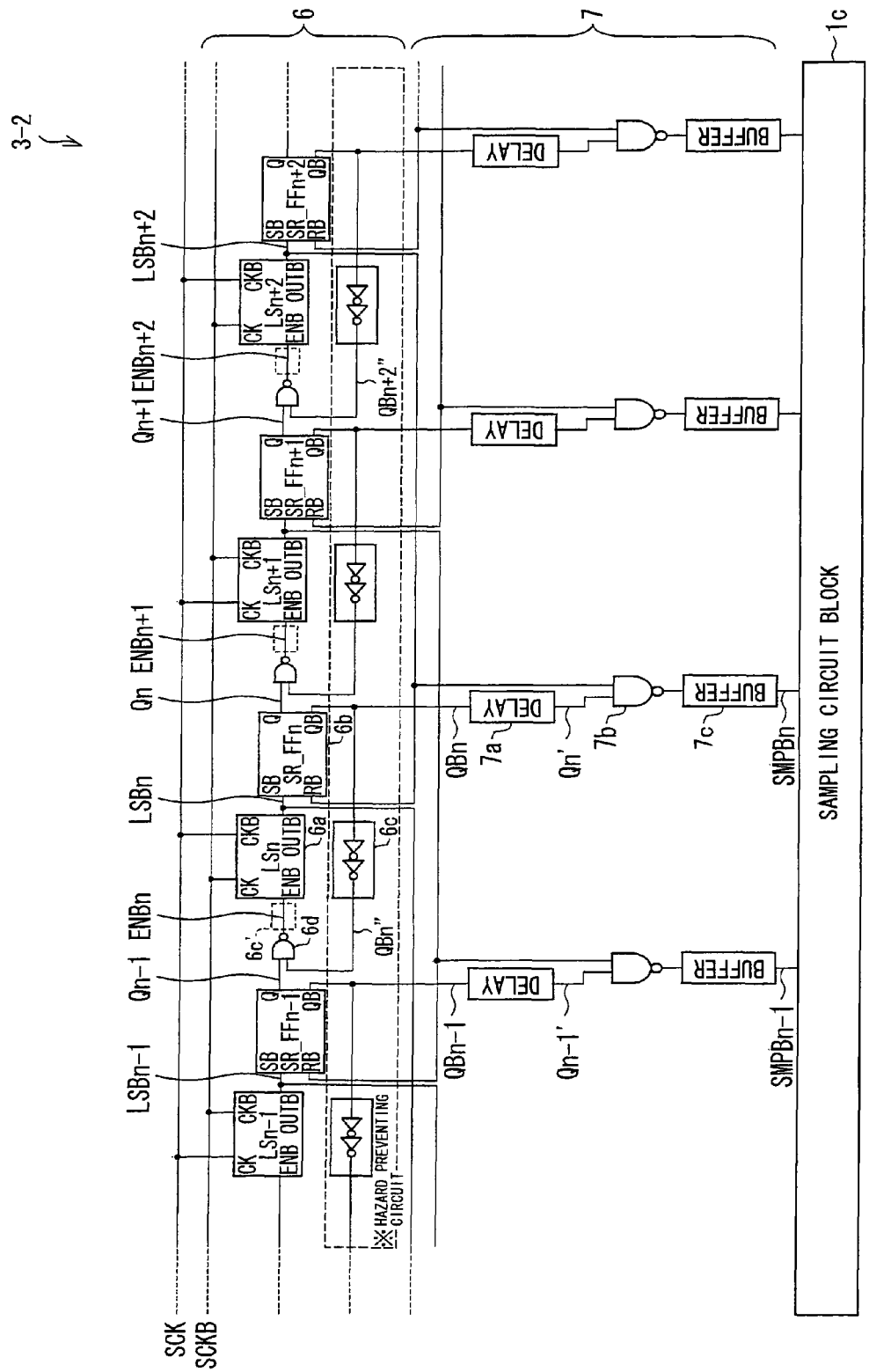
FIG. 4 is a circuit block diagram illustrating a main arrangement of a source driver in accordance with a second embodiment of the present invention.

FIG. 4 illustrates an arrangement of a source driver 3-2 of the present embodiment. The source driver 3-2 includes: a shift register (first pulse generating means) 6; and a delay trimming circuit (second pulse generating means) 7.

The shift register 6 has latch stages, each of which includes: a level shifter 6a; a set-reset flip-flop 6b; a hazard preventing circuit 6c; and a two-input NAND circuit 6d. FIG. 4 illustrates the (n−1)th latch stage through the (n+2)th latch stage.

Figure 5:
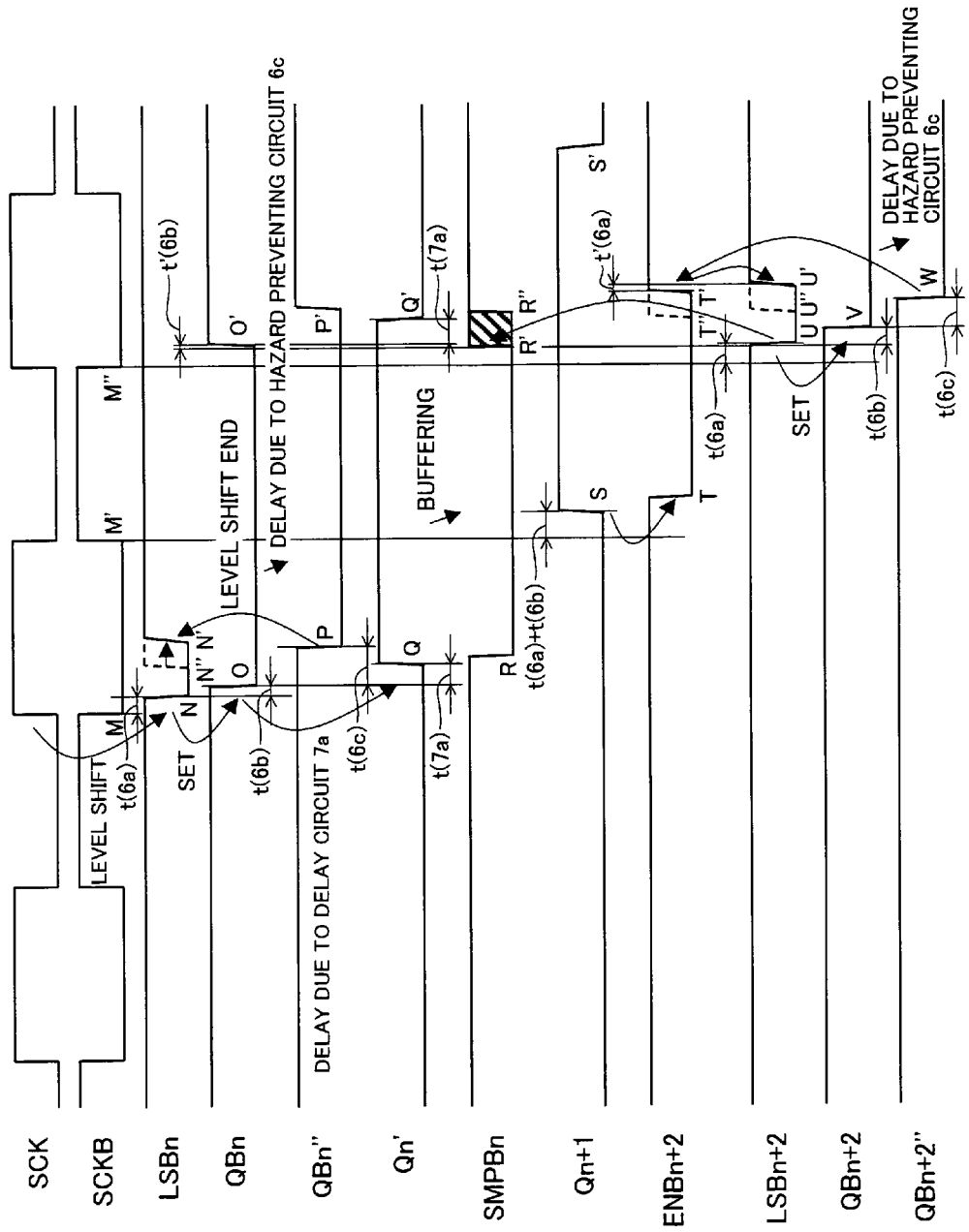
FIG. 5 is a timing chart explaining an operation of the source driver in FIG. 4.

The level shifter 6a has clock input terminals CK and CKB into which clock signals SCK and SCKB to be level-shifted are fed. As illustrated in FIG. 5, the clock signals SCK and SCKB are periodic signals, each of which has its High period and Low period equal to each other. The clock signals SCK and SCKB have their respective phases opposite to each other. One of the clock signals SCK and SCKB is fed into the clock input terminal CK, while the other is fed into the clock input terminal CKB. Such combination is set so as to be opposite between any adjacent latch stages. FIG. 4 illustrates an example arrangement in which: in the (n−1)th latch stage, the clock signal SCK is fed into the clock input terminal CK, while the clock signal SCKB is fed into the clock input terminal CKB; and, in the n-th latch stage, the clock signal SCKB is fed into the clock input terminal CK, while the clock signal SCK is fed into the clock input terminal CKB.

The level shifter 6a level-shifts the clock signal SCK or SCKB that has been fed into the clock input terminal CK and outputs the signal thus level-shifted through its output terminal OUTB. The level shifter 6a is of a current-driven type or of a voltage-driven type. The level shifter 6a has a low-active enable terminal ENB into which enable signals are fed, and carries out a level shift operation while the enable terminal ENB is fed with a Low signal, whereas it does not carry out a level shift operation while the enable terminal ENB is fed with a How signal. The level shifter 6a may be a conventional current-driven or voltage-driven level shifter, an example of which is disclosed in Patent Literature 1.

The level shifter 6a supplies outputs LSB (output signals from the output terminal OUTB are referred to as such for convenience) to an inverted set input terminal SB of the corresponding set-reset flip-flop 6b. The set-reset flip-flop 6b is an asynchronous set-reset flip-flop. When the level shifter 6a supplies a Low pulse as an input pulse from the output terminal OUTB to the inverted set input terminal SB, the set-reset flip-flop 6b outputs a High pulse from its output terminal Q and also outputs a Low pulse from its output terminal QB. The set-reset flip-flop 6b has a low-active reset terminal RB, which is fed with output signals from the output terminal OUTB of another level shifter 6a in the latch stage which is two latch stages after the latch stage in which the above set-reset flip-flop 6b is provided.

The hazard preventing circuit 6c includes an even number of inverters connected in series. The hazard preventing circuit 6c delays input signals. The hazard preventing circuit 6c is fed with outputs Q (output signals from an output terminal Q are referred to as such for convenience) from the set-reset flip-flop 6b in the same latch stage. The hazard preventing circuit 6c supplies outputs QB" to one of the inputs of the NAND circuit 6d. The other input of the NAND circuit 6d is fed with outputs Q from a set-reset flip-flop 6b in the latch stage which is followed by the latch stage which includes the above hazard preventing circuit 6c. The NAND circuit 6d supplies outputs to the enable terminal ENB of the level shifter 6a. In other words, the NAND circuit 6d generates, from the outputs Q from the set-reset flip-flop 6b in the latch stage which is followed by the latch stage which includes the above hazard preventing circuit 6c, enable signals ENB (signals fed into the enable terminal ENB are referred to as such for convenience) to be supplied to the level shifter 6a in the latch stage including the above NAND circuit 6d. A level shifter 6a in the first latch stage may be fed with enable signals that are not generated by a NAND circuit 6d, but generated as appropriate.

The delay trimming circuit 7 includes, in correspondence with each latch stage of the shift register 6: a delay circuit 7a; a two-input NAND circuit 7b; and a buffer 7c. The delay circuit 7a includes an odd number of inverters connected in series. The delay circuit 7a delays input signals and inverts the phase of such input signals. The delay circuit 7a is fed with outputs QB (output signals from an output terminal QB are referred to as such for convenience) from the corresponding set-reset flip-flop 6b. The delay circuit 7a supplies outputs Q' to one of the inputs of the NAND circuit 7b. The other input of the NAND circuit 7b is fed with outputs OUTB from a level shifter 6a in the latch stage that is two latch stages after the latch stage which includes the above set-reset flip-flop 6b that generates the outputs QB fed into the delay circuit 7a.

The NAND circuit 7b supplies outputs as sampling pulses SMPB via the buffer 7c to the sampling circuit block 1a, where the outputs are fed into an analog switch ASW.

With reference to FIG. 5, the following description deals with how the source driver 3-2 having the above arrangement is operated. In the description, the above referential codes representing the signals are followed by their respective corresponding latch stage numbers.

With reference to FIG. 5, when the level shifter 6a in the n-th latch stage is fed with an active enable signal ENB, the level shifter 6a level-shifts a clock signal SCKB and starts to output an output LSB of a Low pulse at timing N. The timing N occurs when an internal delay time t (6a) due to the level shift operation by the level shifter 6a has elapsed after timing M at which the clock signal SCK rises and at which the clock signal SCKB falls. In accordance with this delay, the set-reset flip-flop 6b in the n-th latch stage starts to output, at timing O, an output Qn of a High pulse and an output QBn of a Low pulse. The timing O occurs when an internal delay time t (6b) due to the set operation by the set-reset flip-flop 6b has elapsed after the timing N.

The pulse of the output QBn is delayed for a delay time t (6c) due to the hazard preventing circuit 6c in the n-th latch stage so as to change into the pulse of an output QBn" that starts at timing P. Also, the pulse of the output QBn is delayed for a delay time t (7a) and caused to have a phase inverted due to the delay circuit 7a so as to change into a pulse that starts at timing Q. The output QBn" is subjected to a NAND operation by the NAND circuit 6d with respect to an output Qn−1 so as to change into an enable signal ENBn. This determines the respective end timings N' and O' of (i) the output LSBn from the level shifter 6a and (ii) the outputs Qn and QBn from the set-reset flip-flop 6b, and thereby determines a shift signal to be fed into the next latch stage. The following describes how the pulse shape of the output LSB from the level shifter 6a is determined, with reference to waveforms observed in the (n+2)th latch stage.

An output Qn+1 has a pulse that starts at timing S, which occurs when the sum of (i) the internal delay time t (6a) due to a level shifter 6a and (ii) the internal delay time t (6b) due to a set-reset flip-flop 6b has elapsed after timing M', which occurs when half the signal period of the clock signals SCK and SCKB has elapsed after the timing M. This causes a NAND circuit 6d in the (n+2)th latch stage to perform a NAND operation with respect to the output Qn+1 and an output QBn+2", which is still of a High pulse, so as to generate as an enable signal ENBn+2 a Low pulse having start timing T, which is defined by the timing S.

Timing M" occurs, which is half the signal period of the clock signals SCK and SCKB after the timing M', while the enable signal ENBn+2 is Low, i.e., active. This causes the level shifter 6a in the (n+2)th latch stage to start to output as an output LSBn+2 a Low pulse having start timing U, which occurs when the internal delay time t (6a) due to the level shifter 6a has elapsed after the timing M". This in turn causes the set-reset flip-flop 6b in the (n+2)th latch stage to start to output as an output QBn+2 a Low pulse, which starts when the internal delay time t (6b) due to the set-reset flip-flop 6b has elapsed after the timing U. Subsequently, the hazard preventing circuit 6c in the (n+2)th latch stage generates as an output QBn+2" a pulse having start timing W, the pulse resulting from delaying the pulse of the output QBn+2 for the delay time t (6c). Consequently, the NAND circuit 6d in the (n+2)th latch stage performs a NAND operation with respect to the output Qn+1 and the output QBn+2" so as to end the pulse of the enable signal ENBn+2 at timing T', which is defined by the timing W. Also, the pulse of the output LSBn+2 ends at timing U', which is defined by the timing T'. The timing U' occurs when an internal delay time t' (6a) due to deactivation of the level shifter 6a has elapsed after the timing T'.

The pulse of the output QBn from the set-reset flip-flop 6b in the n-th latch stage ends at timing O' in response to a reset signal, i.e., the pulse of the output LSBn+2 from the level shifter 6a in the (n+2)th latch stage. This causes the pulses of the output QBn" and of the output Qn' to end at timings P' and Q', respectively. The timing O' occurs when an internal delay time t' (6b) due to the reset operation by the set-reset flip-flop 6b has elapsed after the timing U. The timing Q' occurs when a delay time t' (7a) due to the delay circuit 7a has elapsed after the timing O'.

Similarly, ending of the pulse of an enable signal ENBn causes the pulse of the output LSBn to end at timing N' although FIG. 5 omits its causal connection.

The output QBn is delayed for the delay time t (7a) and is caused to have a phase inverted due to the delay circuit 7a so as to change into an output Qn'. The NAND circuit 7b performs a NAND operation with respect to the output Qn' and the output LSBn+2, and subsequently the buffer 7c performs buffering, so that a Low sampling pulse SMPBn is generated. The sampling pulse SMPBn has start timing R that is defined by start timing Q of the pulse of the output Qn', i.e., by the start timing O of the pulse of the output QBn. Further, the sampling pulse SMPBn has end timing R' that is defined by the start timing U of the pulse of the output LSBn+2. Assuming that simply buffering the pulse of the output Qn' having the start timing Q and the end timing Q' causes the sampling pulse SMPBn to end at end timing R", the pulse is so changed as to have a Low portion trimmed, the portion corresponding to the period from the timing R" to the timing R' and being indicated by the area filled with the diagonal lines. The timing R' occurs when the start timing U of the pulse of the output LSBn+2 is delayed due to buffering by the buffer 7c. This consequently generates as the sampling pulse SMPBn a pulse having its delay partly trimmed as above.

Since the output QBn+2 from the set-reset flip-flop 6b in the (n+2)th latch stage has a pulse that starts at timing V, which occurs when the internal delay time t (6b) of the set-reset flip-flop 6b has elapsed after the start timing U of the pulse of the output LSBn+2, generating the sampling pulse SMPB as above allows the delay in the end timing of the sampling pulse SMPBn to be largely trimmed as compared to the case of defining the end timing by the start timing H of the pulse of the output QBn+2.

The following description deals with a hazard preventive function of the hazard preventing circuit 6c.

The hazard preventing circuit 6c performs a NAND operation with respect to (i) an output Q from the set-reset flip-flop 6b in the latch stage which is followed by the latch stage which includes the above hazard preventing circuit 6c and (ii) an output QB", which is generated by delaying for the delay time t (6c) the output QB from the set-reset flip-flop 6b in the latch stage including the above hazard preventing circuit 6c, so as to generate an enable signal ENB. As illustrated in FIG. 5, the pulse of the output QBn+2" starts at the delayed timing W, i.e., the pulse of the enable signal ENBn+2 ends at the delayed timing, T', which in turn causes the pulse of the output LSBn+2 from the level shifter 6a to end at the timing U'. The delay time t (6c) of the hazard preventing circuit 6c is set so that the timing U' is later than the end timing Q' of the pulse of the output Qn'. This allows the result of the NAND operation by the NAND circuit 7b with respect to the output Qn' and the output LSBn+2 to remain High after the result is set to High at the start timing U of the output LSBn+2. This ensures that the delay in the sampling pulse SMPBn corresponding to the period R" through R' is trimmed.

Figure 6:
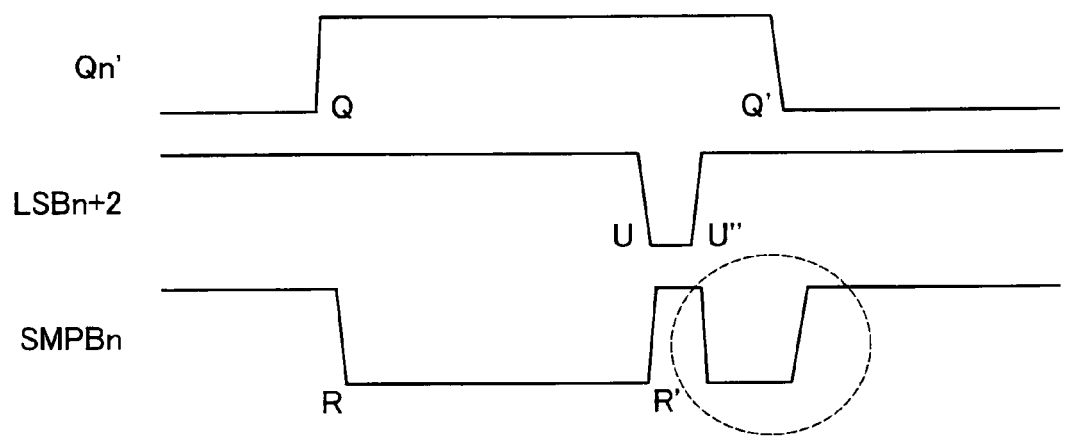
FIG. 6 is a timing chart explaining a hazard caused in the source driver in FIG. 4.

If the hazard preventing circuit 6c were not provided, the pulse of the enable signal ENBn+2 would end at timing T''', which occurs before the timing T' and which is defined by the end timing V of the output QBn+2. As illustrated in FIG. 5, this would cause the pulse of the output LSBn+2 to end at timing U''', which occurs before the timing U'. The timing U''' would occur when the internal delay time t' (6a) due to the level shifter 6a has elapsed after the timing T'. As illustrated in FIG. 6, if the timing U''' occurred before the end timing Q' of the pulse of the output Qn', the result of the NAND operation by the NAND circuit 7b with respect to the output Qn' and the output LSBn+2 would be set to High at the start timing U of the output LSBn+2 and would thereafter be set to Low again for a certain period (circled by a dashed line). This latter Low pulse would cause a hazard in the sampling. The hazard preventing circuit 6c has the above function of preventing such a hazard in the sampling. However, no hazard occurs unless the timing U''' occurs before the timing Q', even without the hazard preventing circuit 6c.

In the above example, the hazard preventing circuit 6c is disposed at such a position as to delay outputs QB from the set-reset flip-flop 6b. However, the positioning is not limited to this; the hazard preventing circuit 6c may be disposed at such a position 6c' (indicated by a dashed line in FIG. 4) as to delay outputs from the NAND circuit 6d.

The purpose of providing the hazard preventing circuit 6c described above in the present embodiment is associated with the following: the level shifter 6a is so arranged as to have an enable terminal ENB and thereby has a period during which its level shift operation is suspended. As is clear from FIG. 5, the pulse period of the sampling pulse SMPB in the present embodiment has a delay trimmed on the basis of a period corresponding to one signal period of the clock signals SCK and SCKB so as to be shorter than one signal period. The set-reset flip-flop 6b has a pulse period corresponding to one signal period of the clock signals SCK and SCKB. Thus, since the output LSB from the level shifter 6a is directly fed as a set signal into the set-reset flip-flop 6b so that the output Q is generated, the enable signal ENB needs to end its active pulse period with the polarity of the clock signal SCK or SCKB which is necessary for a set signal for the set-reset flip-flop 6a.

In the arrangement of the present embodiment, in which the sampling pulse SMPB has a pulse period longer than half that of the clock signals SCK and SCKB, the enable signal ENB has an active pulse period shorter than one pulse period of the clock signals SCK and SCKB. This allows for a longer inactive period of the enable signal ENB fed into the level shifter 6a, thereby significantly reducing power loss.

In a level shifter without an enable terminal ENB, each level inversion of the clock signals SCK and SCKB would cause switching of internal transistors. This would result in power consumption due to switching loss as well as power loss caused by charging and discharging of the gate capacitance, the power consumption occurring in proportion to the clock frequency. This indicates that preventing the switching in a level shifter having an enable terminal ENB while the enable terminal ENB is fed with an inactive enable signal ENB allows the power consumption to be reduced accordingly. A current-driven level shifter has a steady current flowing inside even while the enable terminal ENB is fed with an inactive enable signal ENB, which results in power consumption. Thus, the above prevention of power consumption caused by the switching is especially important.

Further, when the active pulse period of the enable signal ENB is selected to be shorter than one pulse period of the clock signals SCK and SCKB, the NAND circuit 6d performs a NAND operation with respect to (i) the output Q from the set-reset flip-flop 6b in the latch stage which is followed by the latch stage which includes the above NAND circuit 6d and (ii) the output QB from the set-reset flip-flop 6b in the latch stage in which the above NAND circuit 6d is included so that the above active pulse period is set to half the signal period of the clock signals SCK and SCKB. However, the output LSB generated in accordance with the above enable signal ENB has a pulse that ends an extremely short period after its start. This might possibly cause a hazard in the sampling as described above. This is the reason why the hazard preventing circuit 4c is provided.

The present embodiment is described as above. The embodiment includes NAND circuits 7b in the delay trimming circuit 7. However, in the case where it is necessary to level-shift sampling pulses for the purpose of driving the analog switches ASW in the sampling circuit block 1a, the NAND circuits 7b may be substituted by level shifters each of which has an enable terminal and uses an output Qn' as an input signal and an output LSBn+2 as an enable signal. In this case, conventional level shifters each having an enable terminal may be used. An example of such level shifters is the level shifter 103b in FIG. 10, disclosed in Patent Literature 1.

The present embodiment includes the NAND circuit 6d. However, the arrangement is not limited to this; instead, any logical operation circuit may be used which generates enable signals in accordance with output signals from a set-reset flip-flop 6b in the latch stage which is followed by the latch stage which includes the logic operation circuit, provided that such a logic circuit is, when used in combination with a hazard preventing circuit 6c, capable of generating signals having a pulse that ends at timing that is delayed relative to the start timing of the pulse of output signals from a set-reset flip-flop in the latch stage in which the logic circuit is included.

The arrangement of the present embodiment allows for generation of sampling pulses SMPB that are so-called "double duration pulses", i.e., that have a pulse period corresponding to one signal period of the clock signals SCK and SCKB. The arrangement may also be generally applicable to the case of generating sampling pulses SMPB that are "n-time duration pulses" (n being any integer of 2 or above), i.e., that have a pulse period corresponding to n-times half the signal period of the clock signals SCK and SCKB.

In the case of generating "n-time duration pulses", the sampling pulse SMPB in each latch stage in FIG. 4 may be generated simply using an output QB from a set-reset flip-flop 6b in the latch stage that is n latch stages after the target latch stage, as an input to be fed into an input of the NAND circuit 7b in the latch stage in which the sampling pulse SMPB is generated, the input being different from the input into which outputs Qn' are fed. Further, an output QB from the set-reset flip-flop 6b in the latch stage that is n latch stages after the target latch stage may simply be used as a reset signal for the set-reset flip-flop 6b in the latch stage in which the sampling pulse SMPB is generated.

Embodiment 3

Figure 7:
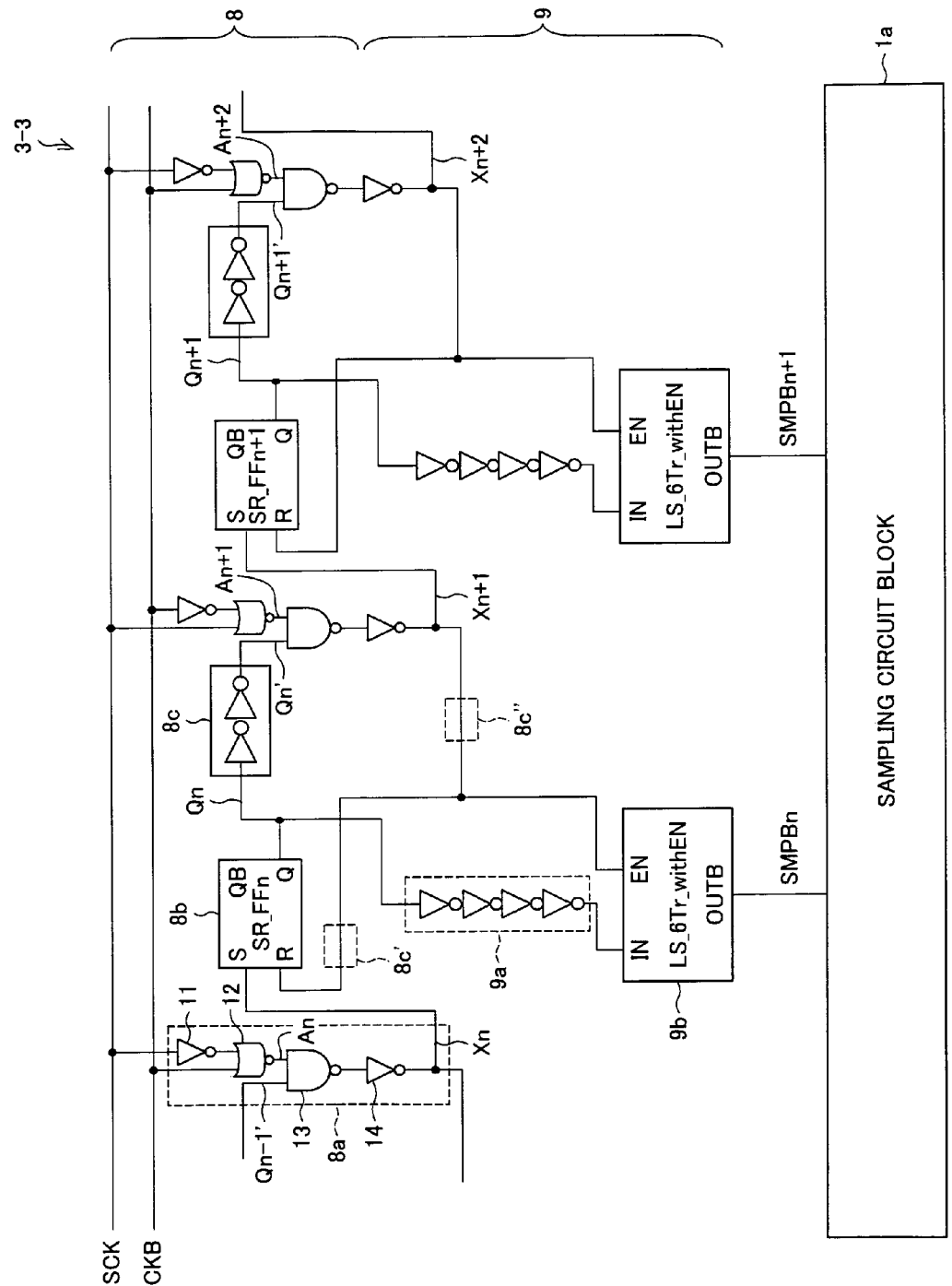
FIG. 7 is a circuit block diagram illustrating a main arrangement of a source driver in accordance with a third embodiment of the present invention.

FIG. 7 illustrates an arrangement of a source driver 3-3 of the present embodiment. The source driver 3-3 includes: a shift register (first pulse generating means) 8; and a delay trimming circuit (second pulse generating means) 9.

The shift register 8 has latch stages, each of which includes: a logic circuit 8a; a set-reset flip-flop 8b; and a hazard preventing circuit 8c. FIG. 7 illustrates the n-th latch stage and the (n+1)th latch stage.

Figure 8:
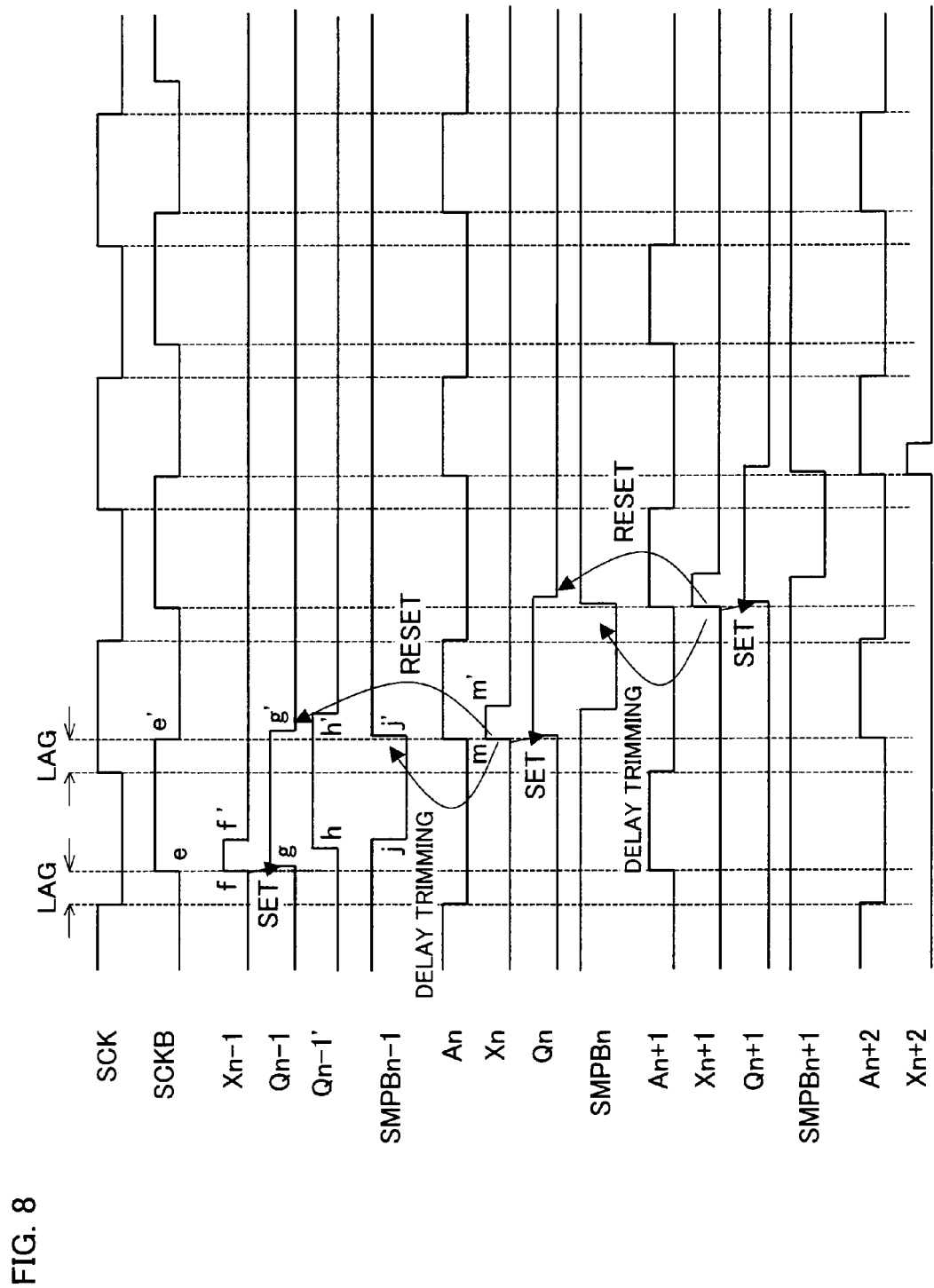
FIG. 8 is a timing chart explaining an operation of the source driver in FIG. 7.

The logic circuit 8a is fed with: clock signals SCK and SCKB; and an output Q' from the latch stage which is followed by the latch stage which includes the above logic circuit 8a, so as to perform a logic operation and to output an output X. The logic circuit 8a includes: an inverter 11; a two-input NOR circuit 12; a two-input NAND circuit 13; and an inverter 14. As illustrated in FIG. 8, the clock signals SCK and SCKB are periodic signals, each of which has its High period and Low period equal to each other. The clock signals SCK and SCKB are fed into the logic circuit 8a at their respective timings between which there is normally no lag. The shift register is so arranged as to be capable of operating normally even when there is a lag between the timings. The present embodiment deals with a case in which there is a lag between the timings. In the present embodiment, the first portion of each High period of the clock signal SCK overlaps the last portion of the corresponding High period of the clock signal SCKB.

One of the clock signals SCK and SCKB is fed into the inverter 11, while the other is fed into an input of the NOR circuit 12. Such combination is set so as to be opposite between any adjacent latch stages. FIG. 7 illustrates an example arrangement in which: in the n-th latch stage, the clock signal SCK is fed into the inverter 11, while the clock signal SCKB is fed into the NOR circuit 12; and, in the (n+1)th latch stage, the clock signal SCKB is fed into the inverter 11, while the clock signal SCK is fed into the NOR circuit 12.

The inverter 11 supplies outputs to the other input of the NOR circuit 12. The NOR circuit 12 supplies outputs A to an input of the NAND circuit 13, while the other input of the NAND circuit 13 is fed with outputs Q' from the latch stage which is followed by the latch stage which includes the above NAND circuit 13. The NAND circuit 13 supplies outputs to the inverter 14. The inverter 14 supplies outputs, which serve as outputs X of the logic circuit 8a.

The set-reset flip-flop 8b is an asynchronous set-reset flip-flop. The set-reset flip-flop 8b is fed as set input signals with the outputs X from the logic circuit 8a in the same latch stage, and supplies outputs Q (output signals from an output terminal Q are referred to as such for convenience). The set-reset flip-flop 8b has a reset terminal R that is fed with outputs X from a logic circuit 8a in the next latch stage.

The hazard preventing circuit 8c includes an even number of inverters connected in series. The hazard preventing circuit 8c delays input signals. The hazard preventing circuit 8c is fed with the outputs Q from the set-reset flip-flop 8b in the same latch stage. The hazard preventing circuit 8c supplies outputs Q', which serve as outputs of its latch stage and which are fed into an input of a NAND circuit 13 included in the logic circuit 8a in the next latch stage.

The delay trimming circuit 9 includes, in correspondence with each latch stage of the shift register 8: a delay circuit 9a; and a level shifter 9b. The delay circuit 9a includes an odd number of inverters connected in series. The delay circuit 9a delays input signals and inverts the phase of such input signals. The delay circuit 9a is fed with the outputs Q from the set-reset flip-flop 8b in the same latch stage. The level shifter 9b, which has an enable terminal EN, is identical to the level shifter 103b in FIG. 10, disclosed in Patent Literature 1. The level shifter 9b has an input terminal IN that is fed with outputs from the delay circuit 9a, while the enable terminal EN of the level shifter 9b is fed with the outputs X from the logic circuit 8a in the next latch stage. The level shifter 9b supplies the pulses of outputs OUTB to a sampling circuit block 1a as sampling pulses SMPB. The level shifter 9b generates the sampling pulses SMPB in the same manner as the NAND circuits 5b and 7b described in Embodiments 1 and 2, respectively.

With reference to FIG. 8, the following description deals with how the source driver 3-3 having the above arrangement is operated. In the description, the above referential codes representing the signals are followed by their respective corresponding latch stage numbers.

First, an output Qn−1' having a pulse illustrated in FIG. 8 is fed from the (n−1)th latch stage. Such a pulse is generated by feeding a set input signal into a set-reset flip-flop 8b in the first latch stage of the source driver 3-3 and by implementing a method, described below, of generating signals in the latch stages. In other words, the first latch stage requires no logic circuit 8a described above. Simply, the set-reset flip-flop 8b is required to be fed with the pulse of an appropriate set input signal. The output Qn−1', which has start timing h, is generated as a result of delaying an output Qn−1 by a hazard preventing circuit 8c for a delay time t (8c). The pulse of the output Qn−1 has start timing g, which occurs when an internal delay time t (8b) due to the set operation by a set-reset flip-flop 8b has elapsed after start timing f of the pulse of an output Xn−1 from a logic circuit 8a. As illustrated in FIG. 8, the start timing f of the pulse of the output Xn−1 is set so as to be defined by timing e at which the clock signal SCKB rises.

As is clear from a description below, the pulses of outputs X have their respective start timings that are defined alternately by the timing at which the clock signal SCKB rises or the timing at which the clock signal SCKB falls. Thus, the set-reset flip-flop 8b in the first latch stage is only required to be fed with set input signals having a pulse with start timing defined by the timing at which the clock signal SCKB rises or the timing at which the clock signal SCKB falls. Alternatively, the pulses of outputs X may have their respective start timings that are defined by the timing at which the clock signal SCK rises or the timing at which the clock signal SCK falls.

The logic circuit 8a in the n-th latch stage generates the pulse of an output Xn from the clock signals SCK and SCKB and the output Qn−1'. The logic circuit 8a is designed so as to perform the above logic operation, in such a manner that the pulse of the output Xn has start timing m that is defined by timing e' at which the clock signal SCKB falls, which occurs half the signal period after the timing e at which the clock signal SCKB rises. The output Xn serves as a reset signal for the set-reset flip-flop 8b in the (n−1)th latch stage, and therefore the start timing m defines end timing g' of the output Qn−1. The pulse of the output Qn−1' has end timing h' that is determined by delaying the end timing g' for the delay time t (8c). The determination of the end timing h' in turn causes end timing m' of the pulse of the output Xn to be determined.

The output Qn−1 is delayed by a delay circuit 9a in the (n−1)th latch stage and is then fed into the input terminal IN of a level shifter 9b, while the output Xn is fed into the enable terminal EN of the level shifter 9b. This causes the level shifter 9b to output a sampling pulse SMPBn−1 from its output terminal OUTB. The sampling pulse SMPBn−1 has start timing j and end timing j'. The end timing m' of the pulse of the output Xn occurs after the end timing of the pulse of a signal generated as a result of delaying the output Qn−1 by the delay circuit 9a in the (n−1)th latch stage. This allows for trimming of delay occurring after the timing j' as in Embodiments 1 and 2.

The above allows for sequential output of sampling pulses SMPB each corresponding to half the signal period of the clock signals SCK and SCKB.

In the above example, the hazard preventing circuits 8c prevent shortening of the pulse period of outputs X for the purpose of generating the sampling pulses SMPB each corresponding to half the signal period of the clock signals SCK and SCKB. In FIG. 8, if the hazard preventing circuit 8c were not provided, the output Xn would have a shorter pulse width since, for example, the pulse of the output Xn would have end timing defined by the end timing g' of the output Qn−1. This causes a hazard in the sampling as described in Embodiments 1 and 2. Providing the hazard preventing circuit 8c allows the end timing of the pulse of the output Xn to be delayed due to the end timing h' of the pulse of the output Qn−1', so that the pulse of the output Xn has the end timing m'. This allows for normal generation of the sampling pulse SMPBn−1.

The hazard preventing circuit 8c is not necessarily required to be positioned as in the above example; it may be disposed at the position 8c' or the position 8c" illustrated in FIG. 7. The position 8c' is between (i) the output of the logic circuit 8a in the next latch stage and the enable terminal EN of the level shifter 9b in the latch stage including the hazard preventing circuit 8c and (ii) the reset terminal R of the set-reset flip-flop 8b in the latch stage in which the above hazard preventing circuit 8c is included. The position 8c" is between (i) the output of the logic circuit 8a in the next latch stage and (ii) the enable terminal EN of the level shifter 9b in the latch stage in which the above hazard preventing circuit 8c is included and the reset terminal R of the set-reset flip-flop 8b in the latch stage in which the above hazard preventing circuit 8c is included. Even in the case of disposing the hazard preventing circuits 8c either at the position 8c' or at the position 8c", the set-reset flip-flops 8b are fed with reset signals obtained as a result of delaying outputs X by the hazard preventing circuit.

The arrangement of the present embodiment allows for generation of sampling pulses SMPB each corresponding to half the signal period of the clock signals SCK and SCKB. The arrangement may also be generally applicable to the case of generating sampling pulses SMPB that are "n-time duration pulses" (n being any integer of 2 or above), i.e., that have a pulse period corresponding to n-times half the signal period of the clock signals SCK and SCKB.

In the case of generating "n-time duration pulses", the sampling pulse SMPB in each latch stage in FIG. 7 may be generated simply by feeding an output X from the latch stage that is n latch stages after the target latch stage, into the enable terminal EN of the level shifter 9b in the latch stage in which the sampling pulse SMPB is generated. Further, the output X from the latch stage that is n latch stages after the target latch stage may simply be used as a reset signal for the set-reset flip-flop 6b. In the case of generating "n-time duration pulses", the latch stages include no level shifters unlike in Embodiments 1 and 2, and therefore no arrangement is required that suspends the operation of level shifters. Further, outputs X from the logic circuit 8*a* do not have a shortened pulse period. This eliminates the need to include hazard preventing circuits.

The arrangement of the present embodiment is applicable to the case in which there occurs no shift in the timing of level inversion between the clock signals SCK and SCKB.

Embodiment 4

Figure 12:
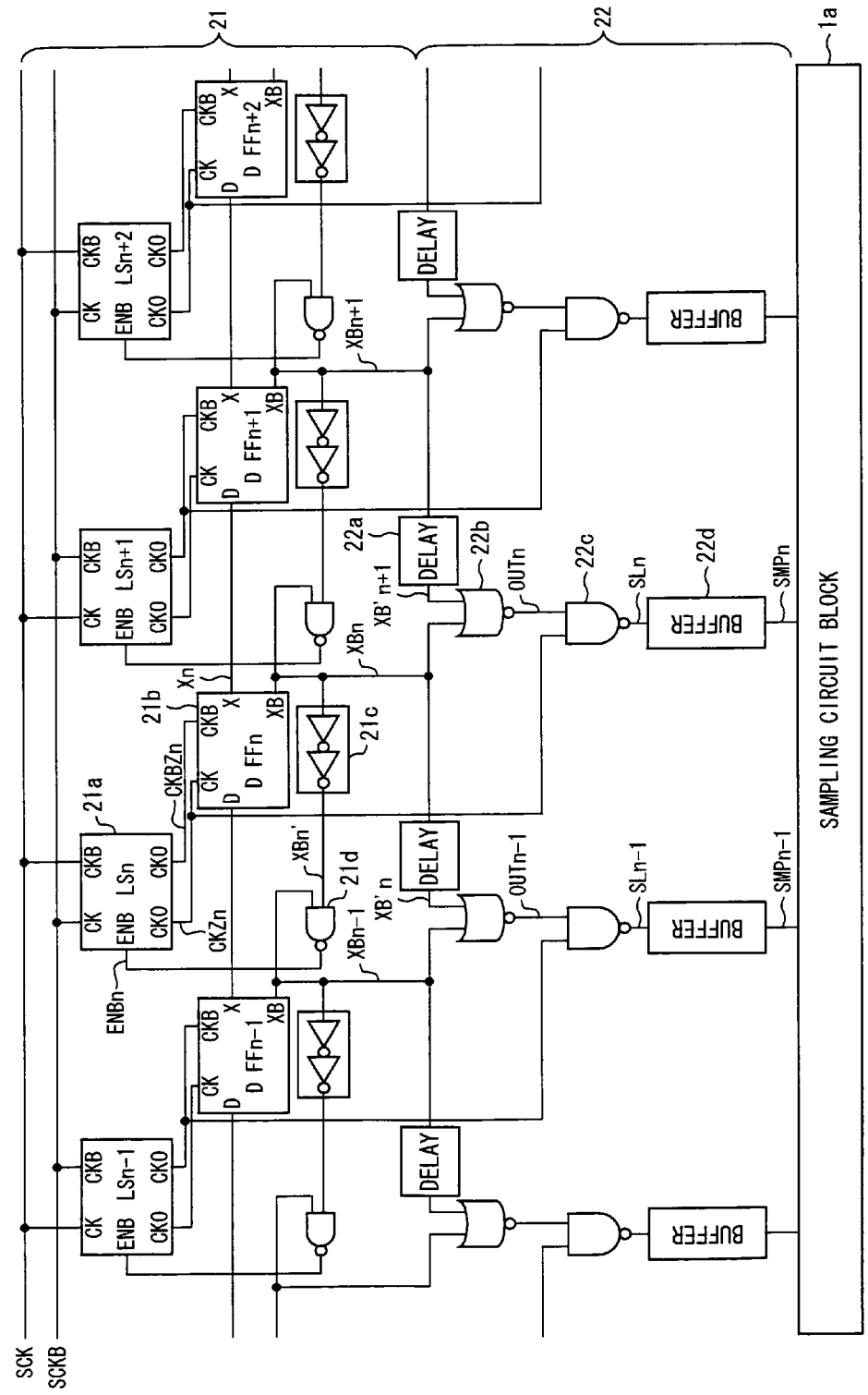
FIG. 12 is a circuit block diagram illustrating a main arrangement of a source driver in accordance with a fourth embodiment of the present invention.

FIG. 12 illustrates an arrangement of a source driver 3-4 of the present embodiment. The source driver 3-4 includes: a shift register (first pulse generating means) 21; and a delay trimming circuit (second pulse generating means) 22.

The shift register 21 has latch stages, each of which includes: a level shifter 21*a*; a D flip-flop 21*b*; a hazard preventing circuit 21*c*; and a two-input NAND circuit 21*d*. FIG. 21 illustrates the (n−1)th latch stage through the (n+2)th latch stage.

Figure 13:
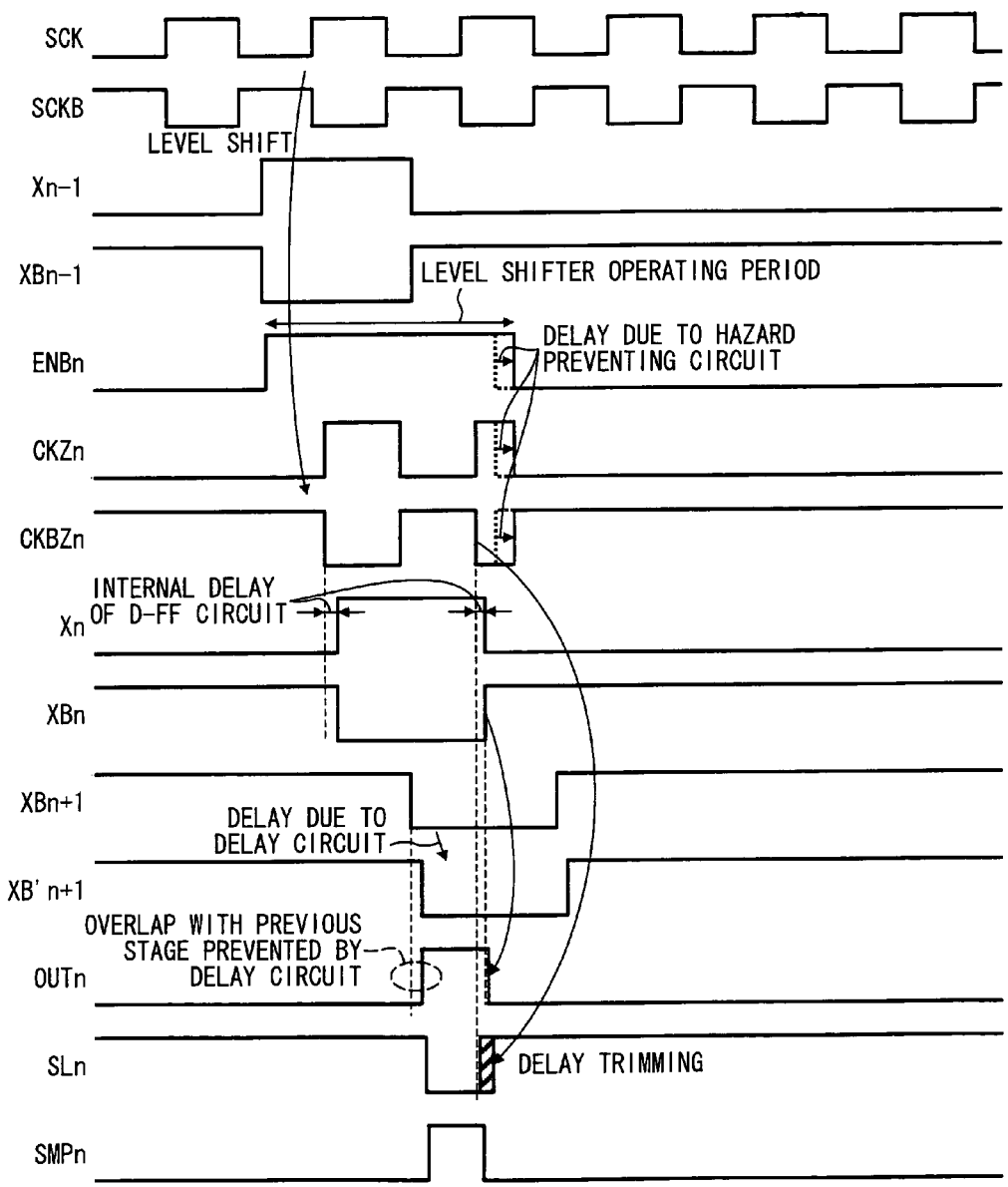
FIG. 13 is a timing chart explaining an operation of the source driver in FIG. 12.

The level shifter 21*a* has clock input terminals CK and CKB into which clock signals SCK and SCKB to be level-shifted are fed. As illustrated in FIG. 13, the clock signals SCK and SCKB are periodic signals, each of which has its High period and Low period equal to each other. The clock signals SCK and SCKB have their respective phases opposite to each other. One of the clock signals SCK and SCKB is fed into the clock input terminal CK, while the other is fed into the clock input terminal CKB. Such combination is set so as to be opposite between any adjacent latch stages. FIG. 12 illustrates an example arrangement in which: in the (n−1)th latch stage, the clock signal SCK is fed into the clock input terminal CK, while the clock signal SCKB is fed into the clock input terminal CKB; and, in the n-th latch stage, the clock signal SCKB is fed into the clock input terminal CK, while the clock signal SCK is fed into the clock input terminal CKB.

The level shifter 21*a* level-shifts the clock signal SCK or SCKB that has been fed into the clock input terminal CK and outputs the signal thus level-shifted through its output terminals CKO and CKO. One of the output terminals CKO and CKO supplies an output CKZ having a phase opposite to the phase of the clock signal SCK or SCKB that has been fed into the clock input terminal CK, whereas the other output terminal CKO supplies an output CKBZ having a phase opposite to the phase of the output CKZ. The level shifter 21*a* is of a current-driven type or of a voltage-driven type. The level shifter 21*a* has a low-active enable terminal ENB into which enable signals are fed, and carries out a level shift operation while the enable terminal ENB is fed with a Low signal, whereas it does not carry out a level shift operation while the enable terminal ENB is fed with a How signal. The level shifter 21*a* may be a conventional current-driven or voltage-driven level shifter, an example of which is disclosed in Patent Literature 1.

The output terminal CKO of the level shifter 21*a* that supplies outputs CKZ is connected to a clock input terminal CK of the D flip-flop 21*b*, whereas the output terminal CKO of the level shifter 21*a* that supplies outputs CKBZ is connected to a clock input terminal CKB of the D flip-flop 21*b*. The D flip-flop 21*b* supplies outputs X (the referential code is shared by the output terminal for convenience) from its output terminal X, the outputs X each having a level equivalent to the logic level of an output that is being fed into the D terminal at a rise of the pulse which is fed from the output terminal CKO of the level shifter 21*a* into the clock input terminal CK. The D flip-flop 21*b* also supplies outputs XB (first pulses; the referential code is shared by the output terminal for convenience) from its output terminal XB, the outputs XB each having a phase opposite to the phase of its corresponding output X. The above D terminal is connected to the output terminal X of a D flip-flop 21*b* in the latch stage which is followed by the latch stage which includes the above D flip-flop 21*b*.

The hazard preventing circuit 21*c* includes an even number of inverters connected in series. The hazard preventing circuit 21*c* delays input signals. The hazard preventing circuit 21*c* is fed with the outputs XB from the D flip-flop 6*b* in the same latch stage. The hazard preventing circuit 21*c* supplies outputs XB′ to an input of the NAND circuit 21*d*. The other input of the NAND circuit 21*d* is fed with outputs XB from the D flip-flop 21*b* in the latch stage which is followed by the latch stage which includes the above NAND circuit 21*d*. The NAND circuit 21*d* supplies outputs to the enable terminal ENB of the level shifter 21*a*. In other words, the NAND circuit 21*d* generates, from the outputs X from the D flip-flop 21*b* in the latch stage which is followed by the latch stage which includes the above NAND circuit 21*d*, enable signals ENB (signals fed into the enable terminal ENB are referred to as such for convenience) to be supplied to the level shifter 21*a* in the latch stage including the above NAND circuit 21*d*. A level shifter 21*a* in the first latch stage may be fed with enable signals that are not generated by a NAND circuit 21*d*, but generated as appropriate.

The delay trimming circuit 22 includes, in correspondence with each latch stage of the shift register 21: a delay circuit 22*a*; a two-input NOR circuit 22*b*; a two-input NAND circuit 22*c*; and a buffer 22*d*. The delay circuit 22*a* includes an even number of inverters connected in series. The delay circuit 22*a* delays input signals. The delay circuit 22*a* is fed with outputs XB from a D flip-flop 21*b* in the next latch stage. The delay circuit 22*a* supplies outputs XB′ to an input of the NOR circuit 22*b*. The other input of the NOR circuit 22*b* is fed with the outputs XB from the D flip-flop 21*b* in the latch stage in which the above NOR circuit 22*b* is included. The NOR circuit 22*b* supplies outputs OUT to an input of the NAND circuit 22*c*. The other input of the NAND circuit 22*c* is fed with the outputs CKZ from the level shifter 21*a* in the same latch stage.

The NAND circuit 22*c* supplies outputs as sampling pulses (second pulses) SMP via the buffer 22*d* to the sampling circuit block 1*a*, where the outputs are fed into an analog switch ASW.

With reference to FIG. 13, the following description deals with how the source driver 3-4 having the above arrangement is operated. In the description, the above referential codes representing the signals are followed by their respective corresponding latch stage numbers.

With reference to FIG. 13, as in Embodiments 1 through 3, the sampling pulse is set to have end timing that occurs before timing defined by the end timing of an output from the flip-flop, i.e., of an output from the first pulse generating means. In the present embodiment, the timing defined as above corresponds to the timing of the outputs CKZ and CKBZ from the level shifter 21*a* in the latch stage in which the above sampling pulse is generated.

With respect to the n-th latch stage, the enable signal ENBn has an extended active period, i.e., the level shifter 21*a* has an extended operating period, due to delay caused by the hazard preventing circuit 21*c*. This allows the respective final timings of outputs CKZn and CKZBn from the level shifter 21*a* to be surely picked up during the active period of the enable signal ENBn, the final timing being defined by the timing at which the clock signal SCK or SCKB rises or falls. Defining end timing of an output SLn from the NAND circuit 22*c* by the final timing allows for trimming of delay represented by the diagonal lines in the waveform of the output SLn although outputs Xn and XBn from the D flip-flop 21*b* occur when an internal delay time due to the D flip-flop 21*b* has elapsed after the timing of the outputs CKZ and CKBZ. A sampling pulse SMPn has start timing that is defined by delaying start timing of an output OUTn due to delay caused in an output XBn+1 by the delay circuit 22*a* so that the output XBn+1 changes into an output XB'n+1. This prevents overlap of sampling pulses SMP in adjacent latch stages with each other.

In the present embodiment, the delay in the sampling pulse SMP is trimmed using the timing of the outputs CKZn and CKZBn from the level shifter 21*a* in the latch stage in which the above delay in the sampling pulse SMP is trimmed. However, the arrangement is not limited to this; the delay in the sampling pulse SMP may be trimmed using the timing of input clock signals to be fed into the clock input terminals CK and CKB of a D flip-flop 21*b* in a predetermined latch stage which is the target latch stage or a latch stage following the target latch stage, the input clock signals not having passed through the D flip-flop 21*b* in the predetermined latch stage.

The embodiments are described as above.

Each of the embodiments includes the arrangement in which, for each latch stage, the second pulse generating means (i) generates from a first pulse a second pulse having end timing generated by use of the timing of a pulse not having passed through a flip-flop in a predetermined latch stage which is the target latch stage or a latch stage following the target latch stage and (ii) supplies the second pulse as a pulse to be outputted from an output terminal.

Each of Embodiments 1 through 3 includes the arrangement in which the second pulse generating means (i) generates from each first pulse a second pulse having: start timing obtained by delaying start timing of the first pulse; and end timing generated by use of start timing of an input pulse into a flip-flop in the latch stage a predetermined number of latch stages after the latch stage in which the first pulse is generated, the input pulse not having passed through the flip-flop in the above latch stage and (ii) supplies the second pulse as a pulse to be outputted from an output terminal. This arrangement allows for use of synchronous set-reset flip-flops as well.

Embodiment 4 includes the arrangement in which the second pulse generating means (i) generates from each first pulse a second pulse having end timing generated by use of timing of an input clock signal into a clock input terminal of a D flip-flop in a predetermined latch stage which is the target latch stage or a latch stage following the target latch stage, the input clock signal not having passed through the D flip-flop in the predetermined latch stage and (ii) supplies the second pulse as a pulse to be outputted from an output terminal.

The pulse input circuits of the present invention are widely applicable in such display devices as display devices each having a panel in which data is outputted sequentially into data lines, e.g., EL display devices, in addition to liquid crystal display devices.

The present invention is not limited to the description of the embodiments above, but may be altered in various ways within the scope of the claims. An embodiment based on a proper combination of technical means disclosed in different embodiments is encompassed in the technical scope of the present invention.

As discussed above, a pulse output circuit of the present invention is a pulse output circuit for sequentially outputting pulses from different output terminals, the pulse output circuit including: first pulse generating means including a shift register having latch stages, connected in series, which have flip-flops for generating first pulses serving as source pulses of the pulses outputted from the output terminals, respectively; and second pulse generating means for (i) generating second pulses from the first pulses of the latch stages, respectively, each of the second pulses having end timing generated using timing of a pulse which has not passed through a flip-flop in a predetermined latch stage which is a target latch stage or a latch stage following the target latch stage and (ii) outputting the second pulses as the pulses outputted from the output terminals, respectively.

As discussed above, a pulse output circuit of the present invention is a pulse output circuit for sequentially outputting pulses from different output terminals, the pulse output circuit including: first pulse generating means including a shift register having latch stages, connected in series, which have flip-flops for generating first pulses serving as source pulses of the pulses outputted from the output terminals, respectively; and second pulse generating means for (i) generating second pulses from the first pulses, respectively, each of the second pulses having: start timing obtained by a delay of start timing of a first pulse; and end timing generated using start timing of an input pulse to a flip-flop in a following latch stage existing a predetermined number of latch stages after a latch stage in which the first pulse is generated the input pulse not having passed through the flip-flop of the following latch stage and (ii) outputting the second pulse as a pulse to be outputted from a corresponding one of the output terminals.

As discussed above, a pulse output circuit of the present invention is a pulse output circuit for sequentially outputting pulses from different output terminals, the pulse output circuit including: first pulse generating means including a shift register having latch stages, connected in series, which have D flip-flops for generating first pulses as source pulses for the pulses outputted from the output terminals, respectively; and second pulse generating means for (i) generating second pulses from the first pulses, each of the second pulses having end timing generated using timing of an input clock signal to a clock input terminal of a D flip-flop in a predetermined latch stage which is a target latch stage or a latch stage following the target latch stage, the input clock signal not passing through the D flip-flop of the predetermined latch stage, and (ii) outputting the second pulse as a pulse to be outputted from a corresponding one of the output terminals. The above allows for provision of a pulse output circuit capable of further trimming delay in output pulses and of securing a sufficient interval between the output pulses.

As discussed above, a pulse output method of the present invention is a pulse output method for sequentially outputting pulses from different output terminals, the pulse output circuit including the steps of: generating, with use of flip-flops in latch stages of a shift register, first pulses serving as source pulses for the pulses outputted from the output terminals, respectively; and generating second pulses from the first pulses of the latch stages, each of the second pulses having end timing generated using timing of a pulse which has not passed through a flip-flop in a predetermined latch stage which is a target latch stage or a latch stage following the target latch stage so that the second pulses are outputted as the pulses outputted from the output terminals, respectively.

As discussed above, a pulse output method of the present invention is a pulse output method for sequentially outputting pulses from different output terminals, the pulse output circuit including the steps of: generating, with use of flip-flops in latch stages of a shift register, first pulses as source pulses for the pulses outputted from the output terminals, respectively; and generating second pulses from the first pulses, each of the second pulses having: start timing obtained by a delay of start timing of a first pulse; and end timing generated using start timing of an input pulse to a flip-flop in a following latch stage existing a predetermined number of latch stages after a latch stage in which the first pulse is generated, the input pulse not having passed through the flip-flop of the following latch stage so that the second pulses are outputted as the pulses outputted from the output terminals, respectively.

As discussed above, a pulse output method of the present invention is a pulse output method for sequentially outputting pulses from different output terminals, the pulse output circuit including the steps of: generating, with use of D flip-flops in latch stages of a shift register, first pulses as source pulses for the pulses outputted from the output terminals, respectively; and generating second pulses from the first pulses, each of the second pulses having end timing generated using timing of an input clock signal to a clock input terminal of a D flip-flop in a predetermined latch stage which is a target latch stage or a latch stage following the target latch stage, the input clock signal not having passed through the D flip-flop in the predetermined latch stage, so that the second pulses are outputted as the pulses outputted from the output terminals, respectively.

The above allows for provision of a pulse output method allowing for further trimming of delay in output pulses and for securement of a sufficient interval between the output pulses.

The concrete embodiments and examples of implementation discussed in the foregoing detailed explanation serve solely to illustrate the technical details of the present invention, which should not be narrowly interpreted within the limits of such concrete embodiments and examples, but rather may be applied in many variations within the spirit of the present invention, provided such variations do not exceed the scope of the patent claims set forth below.

INDUSTRIAL APPLICABILITY

The present invention is suitably applicable to display devices having a high-resolution panel.

REFERENCE SIGNS LIST 1 display panel
2 gate driver
3, 3-1, 3-2, 3-3, 3-4 source driver (display device drive circuit)
4, 6, 8, 21 shift register (first pulse generating means)
4a, 6a, 21a, level shifter
4b, 6b, 8b set-reset flip-flop (flip-flop)
21b D flip-flop (flip-flop)
4c, 6c, 8c, 21c hazard preventing circuit
5, 7, 9, 22 delay trimming circuit (second pulse generating means)

The invention claimed is:

1. A pulse output circuit for sequentially outputting pulses from different output terminals, the pulse output circuit comprising:
a shift register including
a plurality of latch stages, connected in series, which have flip-flops for generating first pulses serving as source pulses of the pulses outputted from the output terminals, respectively; and
a delay trimming circuit for (i) generating second pulses from the first pulses, respectively, each of the second pulses having: start timing obtained by a delay of start timing of a first pulse; and end timing generated using start timing of an input pulse to a flip-flop in a first latch stage existing immediately after a second latch stage in which the first pulse is generated, the input pulse not having passed through the flip-flop of the first latch stage existing immediately after the second latch stage and (ii) outputting the second pulse as a pulse to be outputted from a corresponding one of the output terminals, wherein:
the first latch stage existing immediately after the second latch stage includes
a hazard preventing circuit for outputting an output signal as an enable signal by a delay of the output signal of the flip-flop of the second latch stage, and
a level shifter for (i) carrying out a level-shifting operation with use of the enable signal inputted from the hazard preventing circuit and (ii) generating the input pulse to the flip-flop of the first latch stage existing immediately after the second latch stage;
the hazard preventing circuit of the first latch stage existing immediately after the second latch stage delays the output signal of the flip-flop of the second latch stage so that end timing of the input pulse to the flip-flop, which input pulse is generated by the level shifter, is later than timing obtained by a delay of end timing of the first pulse of the second latch stage.

2. The pulse output circuit according to claim 1, wherein:
each of the flip-flops is a set-reset flip-flop; and
the shift register generates an input pulse to a flip-flop by level-shifting an input clock signal inputted in the shift register.

3. The pulse output circuit according to claim 2, wherein the input pulse to the flip-flop in the first latch stage is used as a reset signal for a flip-flop in the second latch stage in which the first pulse is generated.

4. A drive circuit for a display device, comprising a pulse output circuit recited in claim 1, wherein the second pulse is outputted as a sampling pulse for a video signal of the display device.

5. A display device comprising a drive circuit recited in claim 4.

6. A pulse output method for sequentially outputting pulses from different output terminals, the pulse output circuit comprising the steps of:
generating, with use of flip-flops in latch stages of a shift register, first pulses as source pulses for the pulses outputted from the output terminals, respectively; and
generating second pulses each of the second pulses having: start timing obtained by a delay of start timing of a first pulse; and end timing generated using start timing of an input pulse to a flip-flop in a first latch stage existing immediately after a second latch stage in which the first pulse is generated, the input pulse not having passed through the flip-flop of the first latch stage existing immediately after the second latch stage, and outputting the second pulse as a pulse to be outputted from a corresponding one of the output terminals, wherein:
the first latch stage existing immediately after the second latch stage generates, as an enable signal, a signal obtained by a delay of the output signal of the flip-flop of the second latch stage so that end timing of the input pulse to the flip-flop generated by the level shifter is later than timing obtained by a delay of end timing of the first pulse of the second latch stage; and
the input pulse to the flip-flop is generated by level-shifting a input clock signal with use of the enable signal.

7. The pulse output method according to claim 6, wherein: each of the flip-flops is a set-reset flip-flop.

8. The pulse output method according to claim 7, wherein the input pulse to the flip-flop in the first latch stage is used as a reset signal for a flip-flop in the second latch stage in which the first pulse is generated.

* * * * *

UNITED STATES PATENT AND TRADEMARK OFFICE
CERTIFICATE OF CORRECTION

PATENT NO. : 8,330,745 B2
APPLICATION NO. : 12/312216
DATED : December 11, 2012
INVENTOR(S) : Makoto Yokoyama et al.

It is certified that error appears in the above-identified patent and that said Letters Patent is hereby corrected as shown below:

Title Page, item (54), and Col. 1, lines 1-4, should read;

PULSE OUTPUT CIRCUIT, AND DISPLAY DEVICE DRIVE CIRCUIT, DISPLAY DEVICE, AND PULSE OUTPUT METHOD USING SAME CIRCUIT

Signed and Sealed this
Fifth Day of March, 2013

Teresa Stanek Rea
*Acting Director of the United States Patent and Trademark Office*